(12) United States Patent
Kanbe et al.

(10) Patent No.: US 6,733,868 B1
(45) Date of Patent: May 11, 2004

(54) SUBSTRATE FOR FORMING SPECIFIC PATTERN, AND METHOD FOR MANUFACTURING SAME

(75) Inventors: Sadao Kanbe, Suwa (JP); Shunichi Seki, Suwa (JP); Hitoshi Fukushima, Suwa (JP); Hiroshi Kiguchi, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/630,444

(22) Filed: Aug. 2, 2000

Related U.S. Application Data

(63) Continuation-in-part of application No. 09/462,581, filed as application No. PCT/JP99/02524 on Jan. 11, 2000, now abandoned.

(30) Foreign Application Priority Data

May 14, 1998 (JP) .............................. 10/132446

(51) Int. Cl.[7] .............................. B32B 9/04; G03C 5/00; B41J 2/15; B41J 2/135
(52) U.S. Cl. .................... 428/195.1; 428/447; 430/315; 347/20; 347/45
(58) Field of Search ................ 428/195, 447; 430/315; 347/20, 45

(56) References Cited

U.S. PATENT DOCUMENTS

| | | |
|---|---|---|
| 3,554,125 A | 1/1971 | Van Dorn et al. |
| 3,673,961 A | 7/1972 | Jarvis |
| 4,729,310 A | 3/1988 | Love, III |
| 4,833,486 A | 5/1989 | Zerillo |
| 4,836,105 A | 6/1989 | Hoekstra et al. |
| 4,879,176 A | 11/1989 | Ouderkirk et al. |
| 5,059,513 A | 10/1991 | Hopf et al. |
| 5,145,758 A | 9/1992 | Kossmehl et al. |
| 5,254,429 A | 10/1993 | Gracia et al. |
| 5,272,979 A | 12/1993 | Lewis et al. |
| 5,468,597 A | 11/1995 | Calabrese et al. |
| 6,336,697 B1 * | 1/2002 | Fukushima .................. 347/20 |

FOREIGN PATENT DOCUMENTS

| | | |
|---|---|---|
| DE | 35 35 696 A1 | 10/1985 |
| EP | 0 351 793 A2 | 1/1990 |
| EP | 0 769 331 A1 | 4/1997 |
| EP | 0 794 015 A1 | 9/1997 |
| FR | 701 903 A | 3/1931 |
| GB | 850 934 A | 10/1960 |
| JP | 45-24075 | 9/1970 |

(List continued on next page.)

OTHER PUBLICATIONS

Drake, J. "Chemical Technology in printing and imaging systems", 1993, Royal Society of Chemistry, Cambridge XP002189010, pp. 33–35, and pp. 58–59.

Greg Gillen, et al.; *Patterning of Self–Assembled Alkanethiol Monolayers on Silver by Microfocus Ion and Electron Beam Bombardment;* 320 Appl. Phys. Lett.; 65(5) pp. 534–536 (1994).

*Fabrication of Gold Nanostructures by Lithography with Self–Assembled Monolayers,* IBM Technical Disclosure Bulletin, vol. 39, No. 12; Dec. 1996; pp. 235–238.

Primary Examiner—Cynthia H. Kelly
Assistant Examiner—L. Ferguson
(74) Attorney, Agent, or Firm—Oliff & Berridge, PLC

(57) ABSTRACT

The present invention is a substrate for forming a patterned thin film by causing a specific fluid to adhere. More particularly, this substrate comprises a pattern formation region that is patterned in a specific shape in order to form a film. This pattern formation region is constituted such that an affinity region having an affinity to the fluid is disposed according to specific rules within a non-affinity region not having an affinity to the fluid. The fluid can be uniformly made to adhere to the required region, without spreading out too much or splitting up, allowing a uniform thin film to be formed.

15 Claims, 18 Drawing Sheets

FOREIGN PATENT DOCUMENTS

| | | |
|---|---|---|
| JP | 51-106638 | 9/1976 |
| JP | 51-43769 | 11/1976 |
| JP | 52-40886 | 10/1977 |
| JP | B2-57-4116 | 1/1982 |
| JP | A-58-222592 | 12/1983 |
| JP | 59-075205 | 4/1984 |
| JP | A-64-5095 | 1/1989 |
| JP | B2-3-22467 | 3/1991 |
| JP | A-5-202483 | 8/1993 |
| JP | A-7-166372 | 6/1995 |
| JP | A-7-245467 | 9/1995 |
| JP | A-63-33895 | 2/1998 |
| WO | WO 95/21030 A1 | 8/1995 |
| WO | WO 97/38802 A1 | 10/1997 |
| WO | WO 98/40169 A1 | 9/1998 |

* cited by examiner

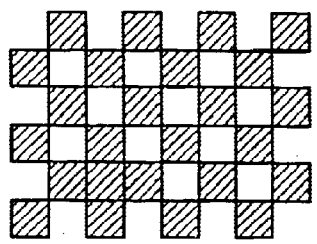
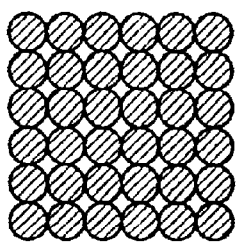
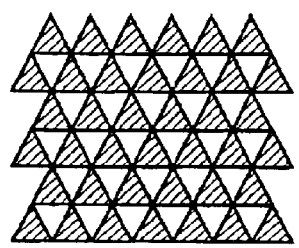
FIG. 2A  FIG. 2B  FIG. 2C
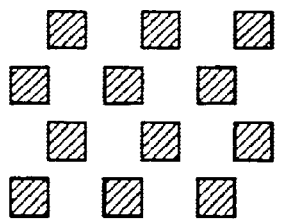
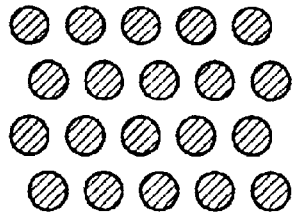
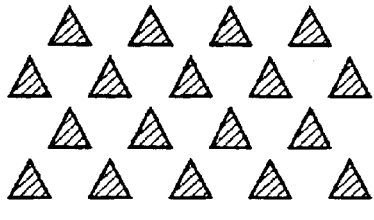
FIG. 2D  FIG. 2E  FIG. 2F
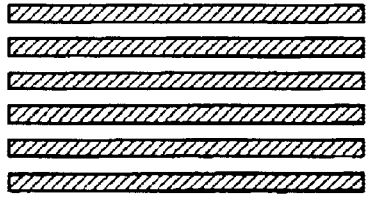
FIG. 2G
▨ AFFINITY REGION 110
☐ NON-AFFINITY REGION 111
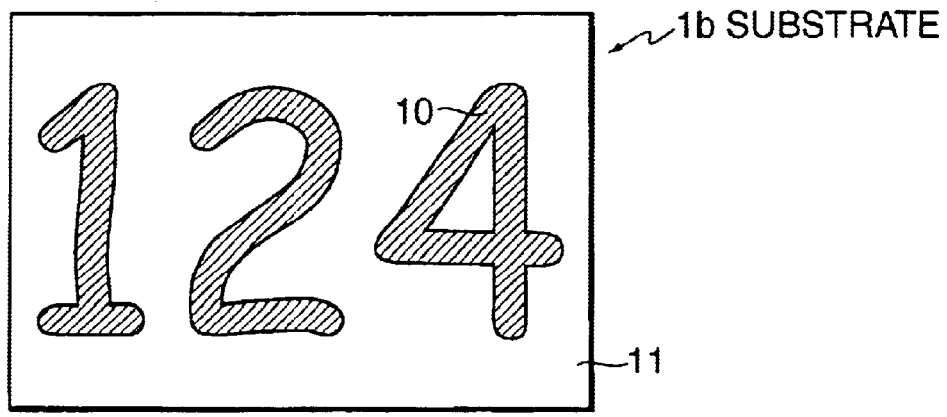
FIG. 3

☒ REGION 10 WHICH EXHIBITS AFFINITY
☐ REGION 11 WHICH DOES NOT EXHIBIT AFFINITY

2: INK-JET-TYPE RECORDING HEAD

MOLECULES WITH THIOL
FUNCTIONAL GROUPS
METAL SURFACE

ETHANOL
1–10mM

1 HOUR AT ROOM
TEMPERATURE

SELF-AGGREGATION
OF THIOL MOLECULES
ON THE METAL SURFACE

TWO-DIMENSIONAL
MONO-MOLECULAR
FILM OF THIOL
MOLECULES

SUBSTRATE FOR FORMING SPECIFIC PATTERN, AND METHOD FOR MANUFACTURING SAME

This is a Continuation-in-Part of application Ser. No. 09/462,581 filed Jan. 11, 2000, now abandoned, which in turn is a National Stage of PCT/JP99/02524 filed on May 14, 1999. The entire disclosure of the prior application(s) is hereby incorporated by reference herein in its entirety.

TECHNICAL FIELD

The present invention relates to changing the shape of a universal substrate, and more particularly to the improvement of a substrate suited to bonding a liquid phase material in a specific pattern.

BACKGROUND ART

Substrates called universal substrates have been around for some time. These substrates had spotted copper film regions to which solder adhered well, with these regions laid out in a regular pattern. It was possible with these universal substrates to solder or otherwise fix parts in any desired position on the substrate. The various parts were connected to other parts via lead wires, or were wired to each other by solder continuously applied by soldering iron in the copper film region.

A certain amount of a fluid must be uniformly bonded over the entire pattern formation region in order to form a thin film in the shape of a pattern having a specific surface area. The above-Mentioned universal substrates, however, were not well suited to such applications.

Accordingly, to bond this specific amount of fluid to a pattern formation region of a specific surface area, it was, of course, necessary to form a bank (dividing member) along the outer periphery of the pattern formation region so that the fluid would not run out of the pattern formation region, and to keep the fluid from running out of the pattern region until it solidified.

A thin film formation method that involved the formation of a bank, however, had numerous drawbacks; namely, the trouble it took to form the bank, the excessive bumpiness of the substrate surface resulting from the bank, and the necessity to select a bank material that would work with both the substrate surface and the fluid.

An ink-jet system which discharges ink jets can be adopted here when the pattern is being formed with a fluid.

The resolution with an ink-jet system is fine at 400 dpi, for example, and it is thought that if a fluid which can be used in industrial applications can be discharged from individual nozzles then it will be possible to form optional patterns with a width of the $\mu$m order. That is to say, with the ink-jet system it is possible to form a pattern if the ink is changed for some other industrial fluid, without the need for facilities such as a factory, and so the ink-jet system is very desirable for use in industrial applications.

However, although useful for forming fine patterns, when such ink-jet systems are used industrially considerable spreading of the liquid droplets of fluid discharged cannot be avoided and, when forming a fine pattern such as those used in the universal substrate type semiconductor process in particular, the formation or a bank along the outer perimeter of the pattern forming region is not achieved to perfection.

DISCLOSURE OF THE INVENTION

In order to solve the above problems, the inventors conceived a method for forming a specific pattern with which it is possible to cause a certain amount of fluid to adhere uniformly without the use of a dividing member or the like within a pattern region of a specific shape.

A first object of the present invention is to provide a substrate to which a suitable amount of fluid will adhere in a pattern formation region of a specific surface area.

A second object of the present invention is to provide a method for manufacturing a substrate to which a suitable amount of fluid will adhere in a pattern formation region of a specific surface area.

An invention that achieves the first object is a substrate for forming a patterned thin film by causing a specific fluid to adhere, comprising a pattern formation region patterned in a specific shape for forming the film. This substrate for forming a specific pattern is characterized in that the pattern formation region is constituted by the disposition according to specific rules of an affinity region having an affinity to the fluid within a non-affinity region not having an affinity to the fluid. For example, this substrate is constituted by the disposition of the pattern formation region by a plurality of specific rules. Alternatively, the pattern formation region is formed in a specific graphic shape.

The "fluid" here is not only an ink, but any medium whose viscosity allows it to be discharged from a nozzle and which can be used in industrial applications. This fluid may be water-based or oil-based. It may also be a colloidal mixture. "Having an affinity" means that the contact angle with respect to the fluid is relatively small, while "not having an affinity" means that the contact angle with respect to the fluid is relatively large. These two expressions are used in contrast to each other for the sake of convenience in order to illustrate the behavior of the film with respect to the fluid. The above-mentioned "affinity region" or "non-affinity region" can be laid out in a spotted pattern, a mosaic pattern, a striped pattern, or any another pattern. The shape of the individual regions may be circular, triangular, rectangular or another such polyhedral shape, or linear. There are no restrictions on the size of the individual regions.

An invention that achieves the second object is a method for manufacturing a substrate for forming a patterned film by causing a specific fluid to adhere, comprising the steps of:

a) forming a paraffin layer by applying a paraffin coating to a base, and b) removing the paraffin layer from an affinity region having an affinity to the fluid by supplying energy along this affinity region such that the affinity region is disposed according to specific rules within a non-affinity region not having an affinity to the fluid in a pattern formation region in which the patterned film is formed.

Another invention that achieves the second object is a method for manufacturing a substrate for forming a patterned film by causing a specific fluid to adhere, comprising the steps of:

a) forming a metal layer from a specific metal on a base, b) removing the metal layer by supplying energy to the region other than the pattern formation region in which the patterned film is formed, c) removing the metal layer from a non-affinity region not having an affinity to the fluid by supplying energy along this non-affinity region such that an affinity region having an affinity to the fluid is disposed according to specific rules within the non-affinity region in the pattern formation region, and d) immersing the base from which the metal has been selectively removed in a mixed liquid containing a sulfur compound.

The above-mentioned sulfur compound preferably has the opposite property from that of the base surface in regard to affinity to the fluid.

Another invention that achieves the second object is a method for manufacturing a substrate for forming a patterned film by causing a specific fluid to adhere, comprising the steps or:

a) masking a base with a mesh mask that covers the region other than a pattern formation region in which the patterned thin film is formed and also covers a non-affinity region not having an affinity to the fluid such that an affinity region having an affinity to the fluid is disposed according to specific rules within the non-affinity region in the pattern formation region, b) plasma-working the base covered with the mesh mask, and c) performing a modification treatment on the molecules dissociated by the plasma working.

Yet another invention that achieves the second object is a method for manufacturing a substrate for forming a patterned film by causing a specific fluid to adhere, comprising the steps of:

a) masking a base with a mesh mask that covers the region other than a pattern formation region in which the patterned thin film is formed and also covers a non-affinity region not having an affinity to the fluid such that an affinity region having an affinity to the fluid is disposed according to specific rules within the non-affinity region in the pattern formation region, and b) performing a modification treatment on the mesh-masked base by irradiating it with ultraviolet rays.

Another invention that achieves the second object is a method for manufacturing a substrate for forming a patterned film by causing a specific fluid to adhere, comprising the steps of:

a) forming a thin film from a material having an affinity to the fluid on a base furnished with a surface not having an affinity to the fluid, b) providing a photoresist that covers an affinity region having an affinity to the fluid such that the affinity region is disposed according to specific rules within a non-affinity region not having an affinity to the fluid in a pattern formation region in which the patterned film is formed, and c) etching the base on which the photoresist has been formed and etching the region other than the region where the photoresist is provided.

Still another invention that achieves the second object is a method for manufacturing a substrate for forming a patterned film by causing a specific fluid to adhere, comprising the steps of:

a) applying a charge to the entire surface of a base, b) dissipating the charge by applying energy to the region other than a pattern formation region in which the patterned thin film is formed, c) dissipating the charge of a non-affinity region not having an affinity to the fluid such that an affinity region having an affinity to the fluid is disposed according to specific rules within the non-affinity region in the pattern formation region, and d) bonding a specific substance to the affinity region where the charge was not dissipated.

Still another invention that achieves the second object is a method for manufacturing a substrate for forming a patterned film by causing a specific fluid to adhere, comprising the step of:

forming an affinity film in an affinity region having an affinity to the fluid such that the affinity region is disposed according to specific rules within a non-affinity region not having an affinity to the fluid in a pattern formation region in which the patterned thin film is formed.

It is preferable here to employ an ink jet method to form the patterned film from a fluid on the substrate. First, the fluid that serves as the material for the film is supplied to a cavity designed so that it can be filled with a fluid from an ink jet recording head. Voltage is then applied to a piezoelectric element designed such that a volumetric change can be effected in the cavity, and droplets of fluid are discharged from a nozzle so that the fluid will adhere evenly over the entire surface of the pattern formation region.

BRIEF DESCRIPTION OF THE DRAWINGS

FIG. 2 is an example of the disposition of the affinity region and non-affinity region in the pattern formation region of the substrate in Embodiment 1, where A is a square pattern, B is a variation thereon, C is a circle pattern, D is a variation thereon, E is a triangle pattern, F is a variation thereon, and G is a line pattern[1];

FIG. 3 is a plan view of a substrate illustrating a variation on the shape of the pattern formation region;

BEST MODE FOR CARRYING OUT THE INVENTION

Embodiments of the present invention will now be described through reference to the figures.

Embodiment 1

Figure 1A:
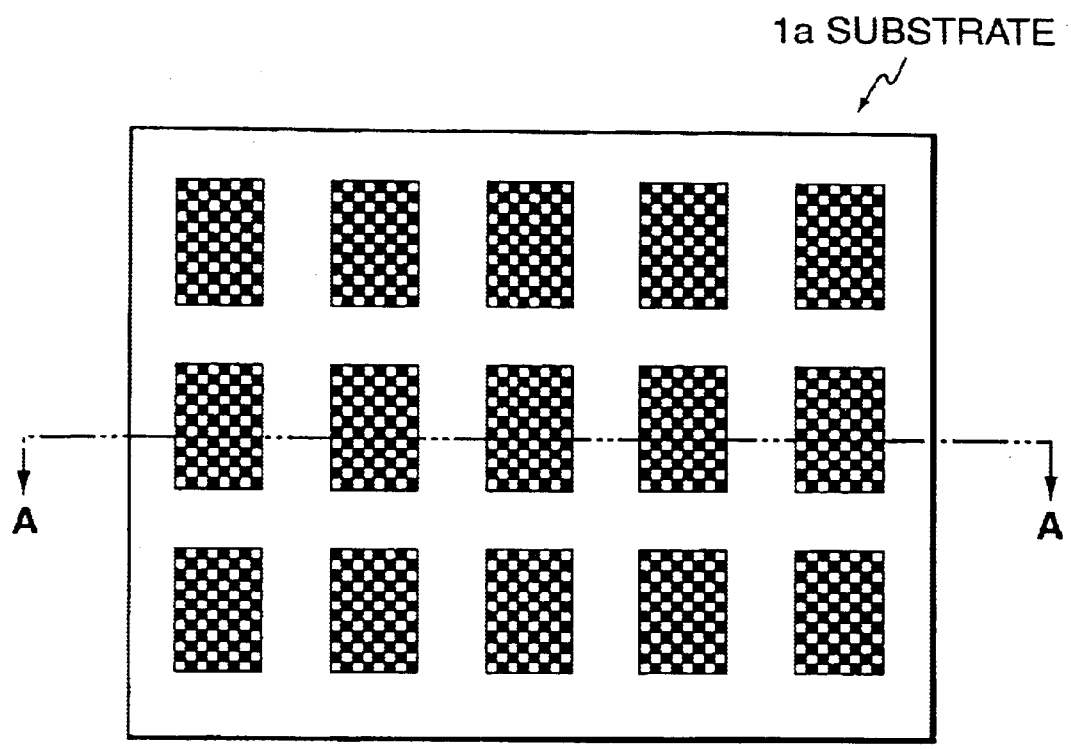
FIG. 1 is the substrate in Embodiment 1, with A being a plan view and B a cross section thereof.
Figure 1B:
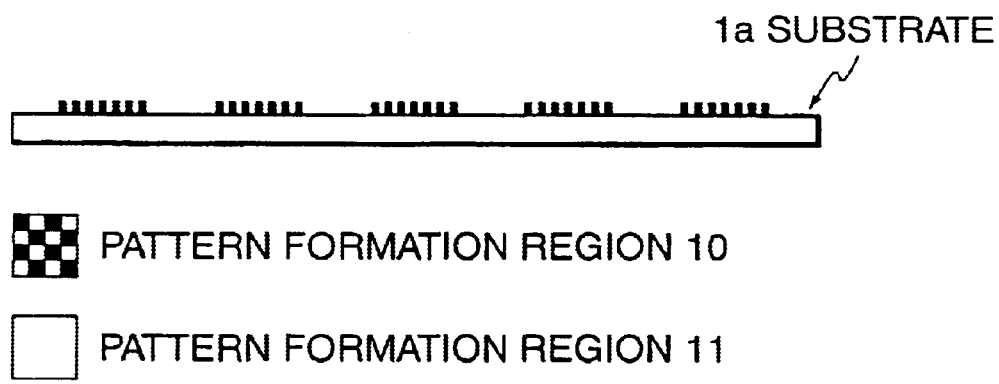

Embodiment 1 of the present invention relates to a substrate structure suited to the formation of a specific pattern. FIG. 1 shows the appearance of the substrate in Embodiment 1. FIG. 1A is a plan view, and FIG. 1B is a cross section along the A—A line in FIG. 1A. As shown in FIG. 1A, the substrate 1a of Embodiment 1 has a pattern formation region 10 disposed in a pattern within a pattern non-formation region 11 on the pattern formation side of a base. The pattern formation region 10 is the region in which a thin film is formed by causing a specific fluid to adhere. The pattern non-formation region 11 is the region in which this thin film is not formed. The pattern non-formation region 11 becomes a region in which the base surface itself is exposed if the base is formed from a material that exhibits no affinity to the fluid.

The pattern formation region 10 consists of affinity regions 110 having an affinity to the fluid, disposed alternately with non-affinity regions 111 not having an affinity to the fluid. The alternating disposition of the affinity regions 110 and non-affinity regions 111 allows the fluid to be bonded in suitable amounts. Alternatively, the entire pattern formation region may consist of just an affinity region 110. The shape, size and roughness of the pattern can be varied appropriately in accordance with the magnitude of the surface tension of the fluid, for example in accordance with the contact angle or the size of the liquid droplets.

The affinity regions 110 can be disposed in a pattern in which square regions are touching each other as in FIG. 2A, or in a pattern in which square regions have a specific spacing between them as in FIG. 2D. They can also be disposed in a pattern in which circular regions are touching each other as in FIG. 2B, or in a pattern in which circular regions have a specific spacing between them as in FIG. 2E. They can also be disposed in a pattern in which triangular regions are touching each other as in FIG. 2C, or in a pattern in which triangular regions have a specific spacing between them as in FIG. 2F. Another possible pattern consists of parallel lines as in FIG. 2G. In addition to these, any other polyhedral shapes, irregular shapes, or the like can be utilized.

A detailed description follows, taking the circular region (fixed distance arrangement) shown in FIG. 2E from among the abovementioned patterns as an example.

Figure 14A:
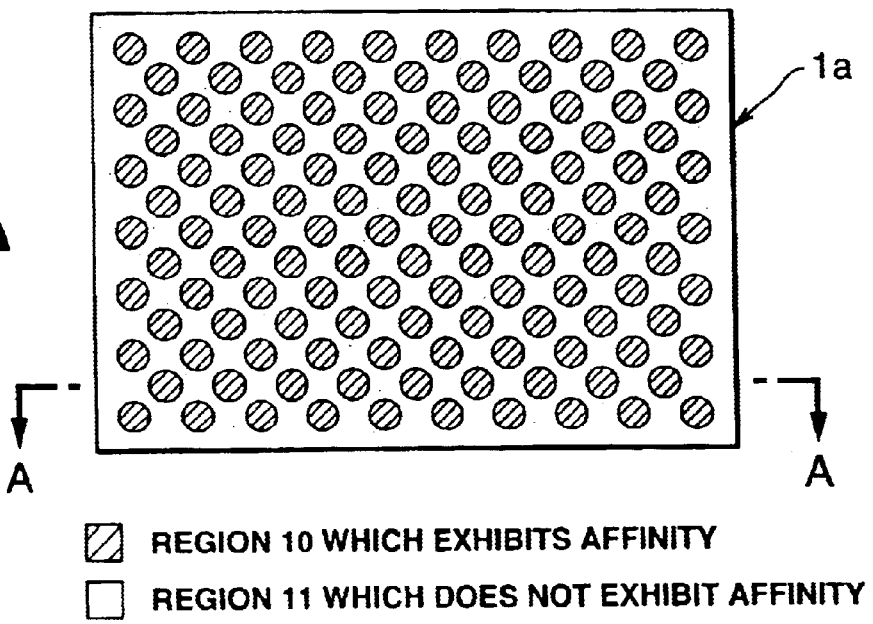
FIG. 14 is a plan drawing and a cross sectional drawing of a substrate which illustrate the details of a fist embodiment.
Figure 14B:
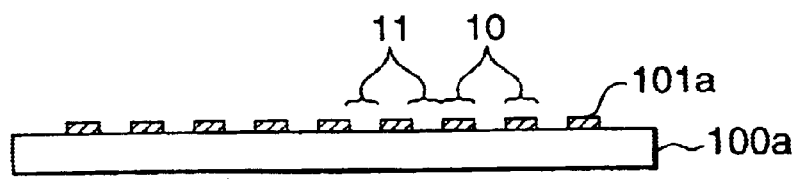
Figure 14C:
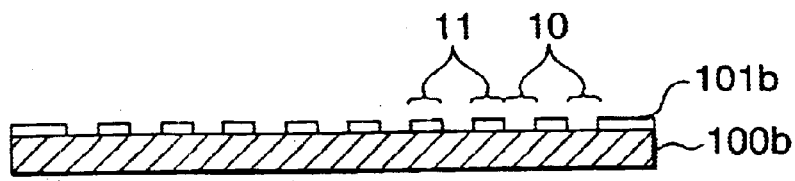

A plan drawing of the substrate of this embodiment 1 is shown in FIG. 14. Here (a) is a plan drawing, (b) is a cross sectional drawing in the direction AA, and (c) is a variation of (b).

As shown in (a), the substrate 1a of this embodiment is furnished with affinity regions 10 which have an affinity for the prescribed fluid and regions 11 which have no affinity for the fluid.

As shown in (b), the substrate 1a is constructed by forming film 101a which exhibits affinity in the affinity regions 10 on a base 100a which has a composition which exhibits no affinity for the fluid. Alternatively, as shown in (c), the substrate 1a is constructed by forming a film 101b which exhibits no affinity in the regions 11 where the affinity is to be eliminated on a base 100b which has a composition which exhibits an affinity for the fluid.

The substrate is constructed by forming the circular film 101a which exhibits affinity on the base 100a which does not exhibit affinity or by forming on the substrate 100b which exhibits affinity a film 101b which does not exhibit affinity in which circular holes are established.

The shape of the pattern of each affinity region 10 may be elliptical rather than truly circular. Furthermore, as in the case of the substrate 1a shown in FIG. 14(a), the arrangement may be such that there is no contact between the patterns or, as in the case of the substrate shown in FIG. 2B, the arrangement may be such that there is contact between the patterns.

As is clear from the above, in the case of a dot-like pattern the size of the dot pattern is preferably such that the amount of an extended liquid droplet cannot be accommodated in one of the affinity regions 10 and there is leakage to the surroundings. If the dot-like pattern is too small when compared with the liquid droplets then the surface tension which is produced at the boundary of an individual affinity region is weak and spreading of the liquid droplet cannot be prevented, and this is the same as in the case of discharge onto a normal substrate. Furthermore, if the dot-like pattern is too small when compared with the liquid droplets, the liquid droplets will not extend to the boundaries of the individual affinity regions and there is a risk that the profile will be strained or that the pattern may be broken.

Hence, the relationship between the size of the dot-like pattern and the size of the liquid droplets depends on the contact angle of the fluid, but it is desirable that the area of the dot-like pattern should be a little smaller than the area over which a liquid droplet normally extends.

Furthermore, the arrangement of the dot-like pattern of the affinity regions is preferably such that there is point-contact between the individual patterns. This is because if the individual patterns are in contact and completely connected it is impossible to check the surface tension at the boundaries of the affinity regions and there is a risk that the liquid droplets will invade uncontrollably the adjoining regions which do not exhibit affinity. Conversely, it is also because if the separation of the dot-like pattern is too great then the continuity of the liquid droplets is impeded and there is a risk of a break appearing in the liquid droplet pattern.

Figure 4A:
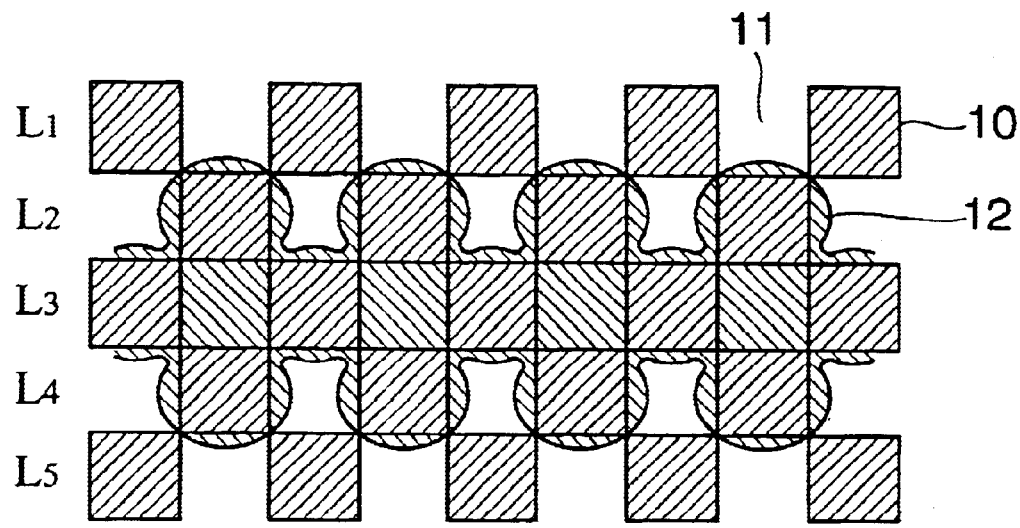
FIG. 4 is a diagram illustrating the operation of the substrate in Embodiment 1, with A being a spotted pattern and B a linear pattern.
Figure 4B:
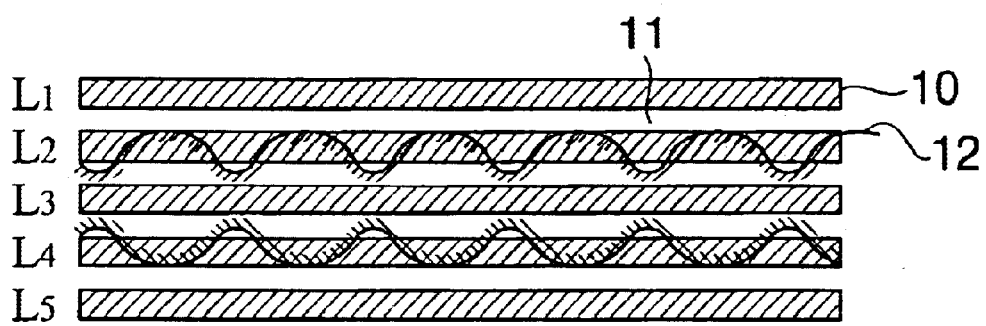

On the other hand, with the line-like pattern as shown in FIG. 4B, the liquid droplets 12 extend along the line L3 and connect with adjacent liquid droplets. With this line-like pattern the liquid droplets 12 are limited to extending between the lines L2 and L4 and the connected liquid droplets are taken up with the line L3 as center and do not spread wider than the width of the lines L2 and L4. The line L3 is continuous and so the liquid droplets 12 spread in such a way that they overlap and there is no break in the liquid droplet pattern.

With a line-like pattern the width of the line-like affinity region 10 which is preferably narrower than the diameter 12 of an extended liquid droplet. This is because if the affinity region 10 has such a width the surface tension of the liquid droplets acts at the boundary and the profile of the liquid droplet pattern becomes line-like.

Method of Pattern Formation

The method of pattern formation using a substrate of this embodiment is described below. When a substrate as described above is coated with liquid droplets the attachment region of the liquid droplets is exceeded and the pattern spreads and contracts on drying and there are no breaks in pattern and so the pattern can be drawn using any method. However, in cases where a fine pattern is to be drawn in an optional shape at high speed it is desirable that it should be drawn using the ink-jet system. The formation of a pattern on a substrate using the ink-jet system is described below.

Figure 15:
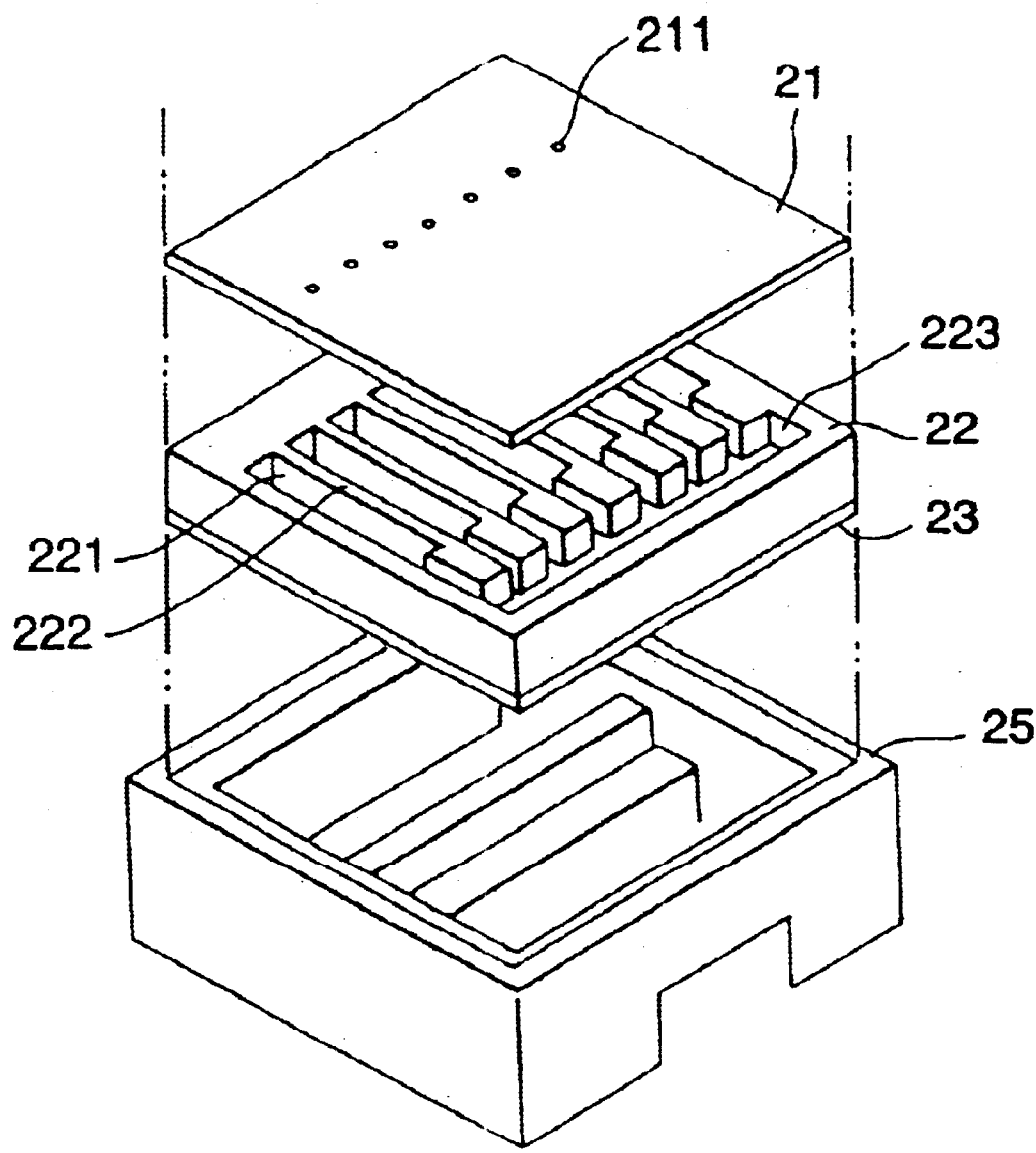
FIG. 15 is an exploded oblique drawing of an ink-jet recording head.
Figure 16:
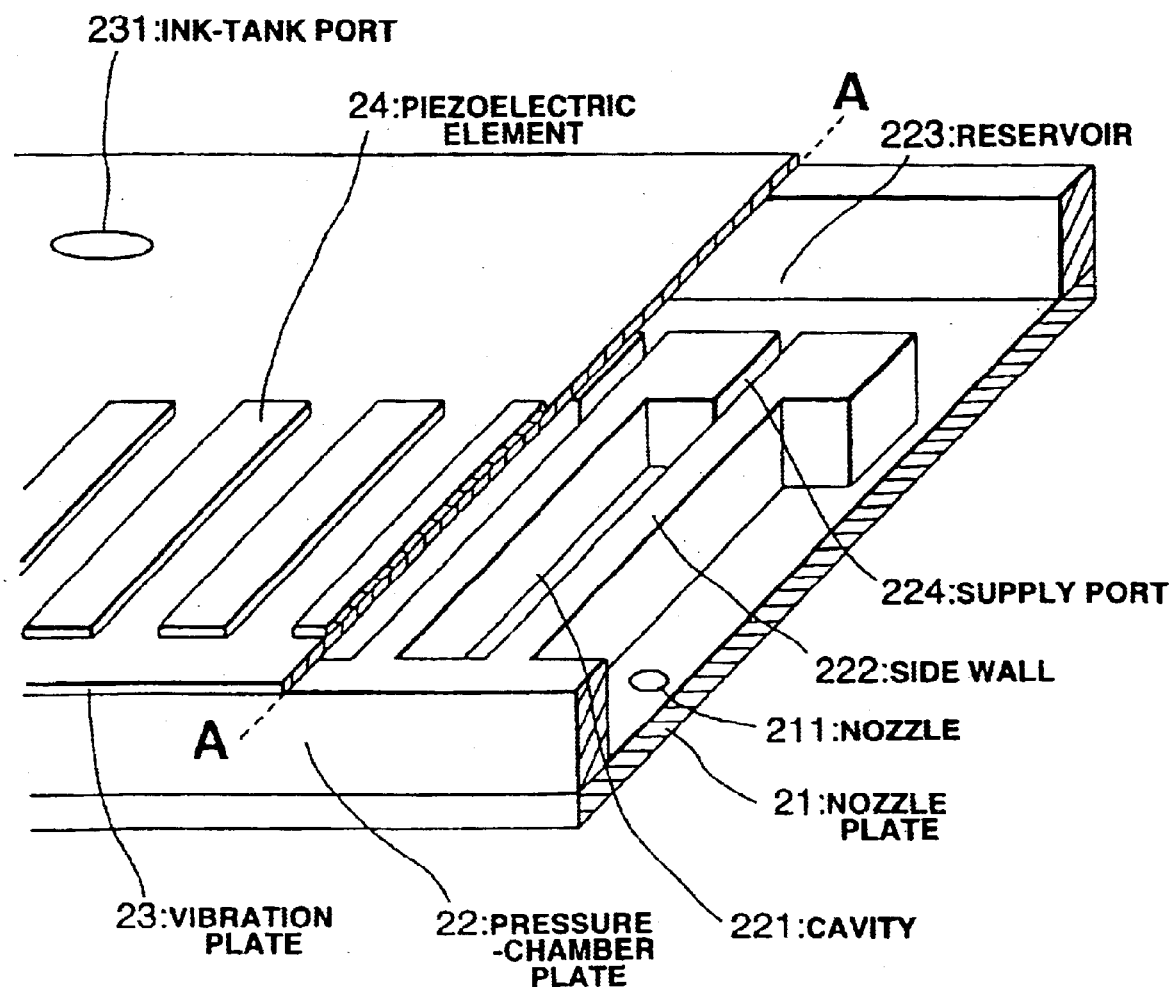
FIG. 16 is an oblique and part cross sectional drawing of the main part of an ink-jet recording head.

The construction of the ink-jet system recording head will be described first of all. FIG. 15 is an exploded oblique drawing of an ink-jet recording head 2. As shown in the drawing, the ink-jet recording head 2 is constructed by sandwiching a nozzle plate 21 in which the nozzles 211 are established and a pressure-chamber substrate 22 on which a vibrating plate 23 is established within the frame 25. The pressure chamber substrate 22 is formed by etching silicon, for example, and is provided with the cavities (pressure chambers) 221, side walls 222 and reservoir 223, for example, FIG. 16 is an oblique and part cross sectional drawing of the construction of the main parts of an ink jet type recording head which has been constructed by laminating together a nozzle plate 21, a pressure-chamber substrate 22 and a vibrating plate 23. As shown in the drawing, the main part of the ink-jet type recording head 2 is furnished with a construction where the pressure chamber substrate 22 is sandwiched between the nozzle plate 21 and the vibrating plate 23. The nozzle plate 21 is provided with the nozzles 211 such that when it is bonded with the pressure chamber substrate 22 the nozzles are arranged in positions corresponding to the cavities 221. A plurality of concavities 221 which can function individually as pressure chambers is established by etching a silicon single crystal substrate, for example, to provide the pressure-chamber substrate 22. The cavities 221 are separated by the side walls 222. Each cavity 221 is connected to the reservoir 223, which is a common flow-way, via the supply ports 224. The vibrating plate 23 is constructed by means of a thermal oxide film for example. The piezoelectric elements 24 are formed on the vibration plate 23 in positions corresponding to the cavities 221. Furthermore, the ink-tank port 231 is established in the vibration plate 23 and the construction is such that any fluid can be supplied from an ink-tank which is not shown in the drawing. The piezoelectric elements 24 are furnished with a construction where PZT elements, for example, are sandwiched between an upper electrode and a lower electrode (not shown in the drawing).

Figure 17:
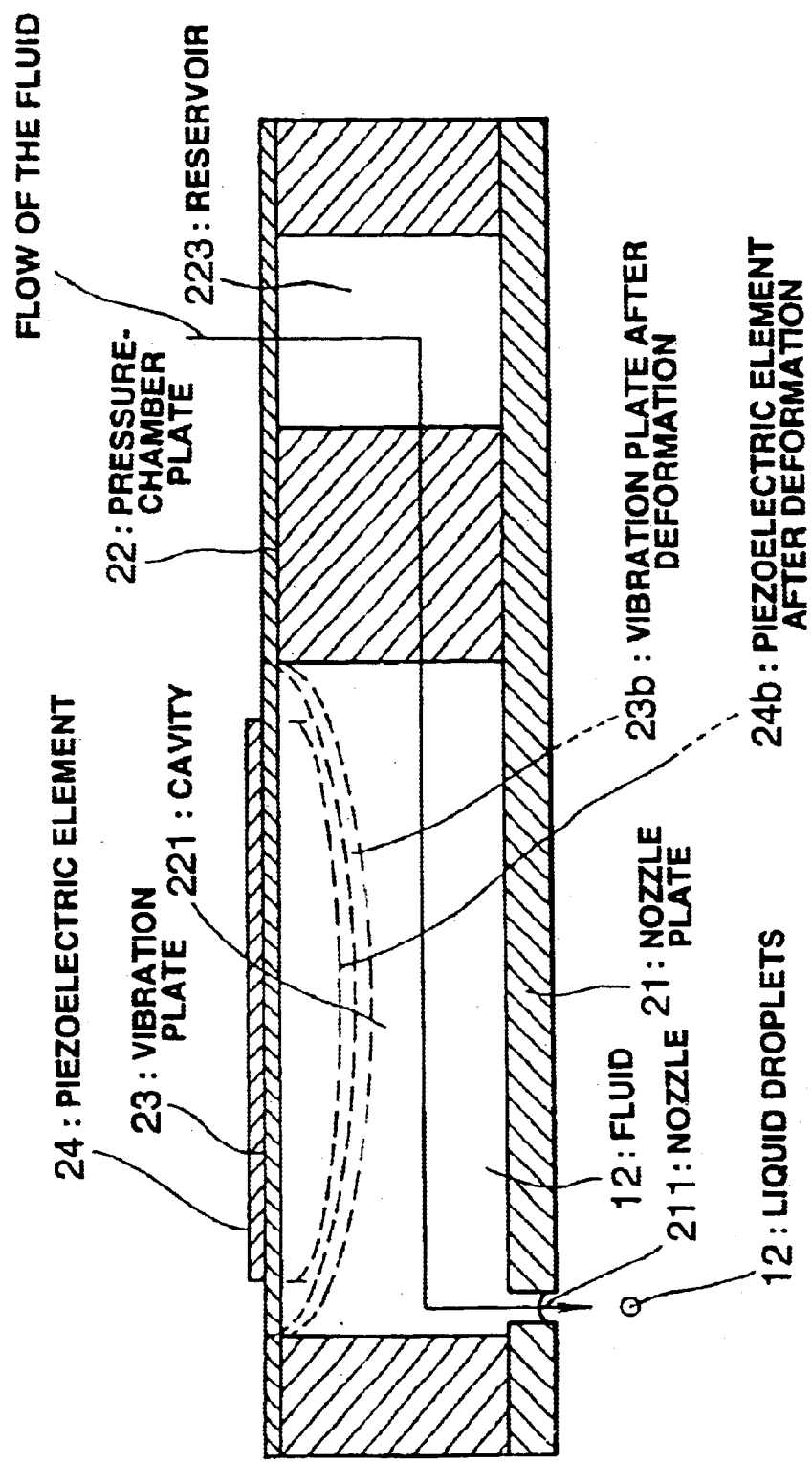
FIG. 17 is an explanatory drawing the general principle of ink discharge from an ink-jet recording head.

The discharging principle of the ink-jet type recording head is described below with reference to FIG. 17. This drawing is a cross sectional drawing along the line A—A in FIG. 16. The fluid 12 is supplied from the ink-tank which is not shown in the drawing through the ink-tank port 231 which is established in the vibrating plate 23 and enters the reservoir 223. The fluid 12 flows from the reservoir 223 through the supply ports 224 and into each of the cavities 221. The piezoelectric elements 24 change in volume when a voltage is applied between the upper electrode and the lower electrode. This change in volume deforms the vibrating plate 23 and changes the volume of the cavity 21.

There is no deformation of the vibrating plate in the state where no voltage is being applied. However, when a voltage is applied the vibrating plate 23b and the piezoelectric element 24b after deformation are deformed to the positions indicated by the broken lines in the drawing. When the volume inside the cavity 21 changes the pressure of the fluid 12 which fills the cavity 21 is increased. The fluid 12 is thus supplied to the nozzle 211 and liquid droplets 12 are discharged.

Figure 18A:
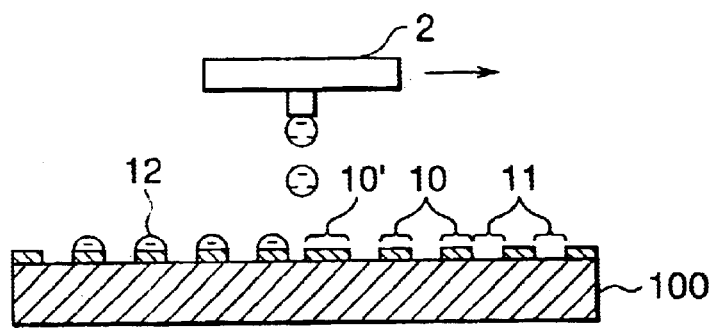
FIG. 18 is a process drawing of a pattern forming method.
Figure 18B:
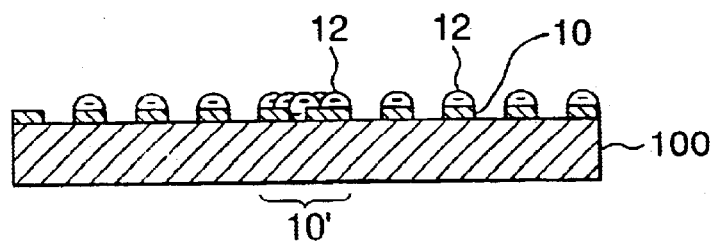

The pattern forming method is described below with reference to FIG. 18. As shown in FIG. 18(a), the piezoelectric elements 24 are driven continuously as the ink-jet type recording head 2 is being moved along the prescribed pattern and liquid droplets of the fluid 12 are discharged onto the substrate 1 of this invention. The affinity regions 10 are established on the substrate 1 and so the liquid droplets 12 are spread out along the prescribed pattern. The action which maintains the liquid droplets 12 along the affinity region 10 is the same as that described earlier. When the liquid droplets 12 have been discharged over the whole pattern, a state in which the liquid droplets 12 are spread continuously over the affinity regions 10 in the form of the pattern is achieved. When there is an affinity region 10' which forms a gap the liquid droplets are connected by overrunning the gap. If the quantity of liquid droplets being discharged from the ink-jet type recording head 2 and the travelling speed are controlled appropriately then an unbroken pattern can be formed on the substrate 1. After pattern formation, optional processes for fixing the fluid are carried out and pattern formation is completed.

Whether or not affinity is exhibited here is determined by the properties of the fluid with which the pattern is to be formed. For instance, if the fluid is one that includes polar molecules, such as water, then the surface region having polar groups will exhibit an affinity, while the surface region not having polar groups will not exhibit an affinity. Conversely, if the fluid is one that does not include polar molecules, such as many organic media, then the surface region having polar groups will not exhibit an affinity, while the surface region not having polar groups will exhibit an affinity. Which fluid to use is determined by what kind of material will be used to form the thin film. In this embodiment, the pattern non-formation region 11 is the material of the base so that it will not exhibit an affinity to the fluid. The non-affinity regions 111 of the pattern formation region 10 are portions where the surface of the base is exposed, just as with the pattern non-formation region 11.

Table 1 shows examples of the materials that can be used as the pattern non-formation region 11 and non-affinity regions 111, and materials that can be used as the affinity regions 110 in this embodiment.

TABLE 1

| Constituent element | When the fluid contains polar molecules | When the fluid does not containing polar molecules |
| --- | --- | --- |
| Pattern non-formation region 11 Non-affinity regions 111 | BAKELITE ™, polyester, polyethylene, TEFLON ™, PMMA, polypropylene, vinyl chloride | Polyvinyl alcohol, polyacrylic acid, nylon, glass |
| Affinity regions 110 | sulfur compounds having OH groups, silane coupling agents having OH, COOH, NH$_2$, or other such groups | sulfur compounds having alkyl groups, organic compound films (such as paraffin) |

The shape, disposition, size, and so forth of the pattern formation region 10 can be set as desired according to the intended application. The pattern formation region 10 shown in FIG. 1A consists of squares disposed in a regular pattern. Naturally, in addition to square, the shape of the pattern formation region may also be another polyhedral shape, circular, or an irregular shape. The pattern formation region 10 may also be formed into graphics, such as characters or symbols, as shown in FIG. 3. This applies to when a thin film of the fluid is made to adhere in the shape of characters, symbols, and so on. The disposition of the pattern formation region need not be regular, and may instead be irregular. There are no particular restrictions on the size of the pattern formation region, and this region can be variously increased or decreased in size.

Operation of the Invention

Figure 5A:
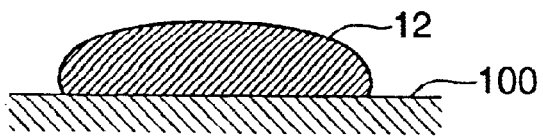
FIG. 5 is a cross section of when droplets are discharged onto an ordinary substrate, with A being immediately after discharge and B after drying.
Figure 5B:
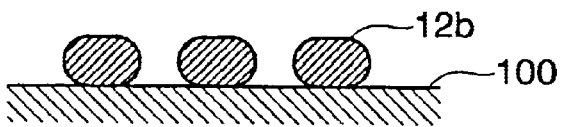
Figure 6A:
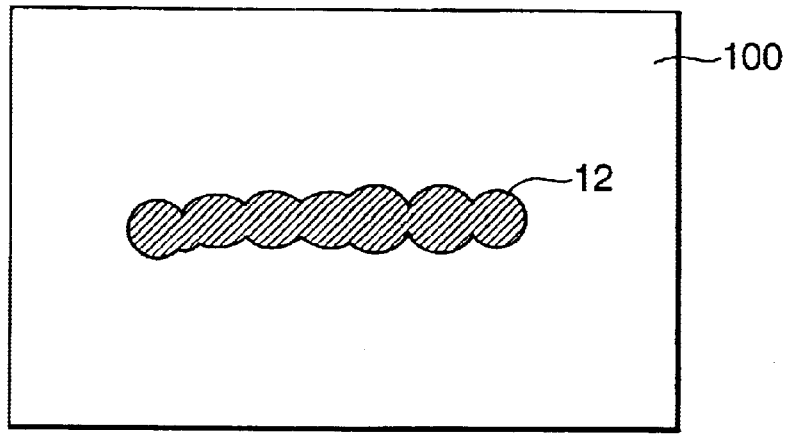
FIG. 6 is a plan view of when droplets are discharged onto an ordinary substrate, with A being immediately after discharge and B after drying.
Figure 6B:
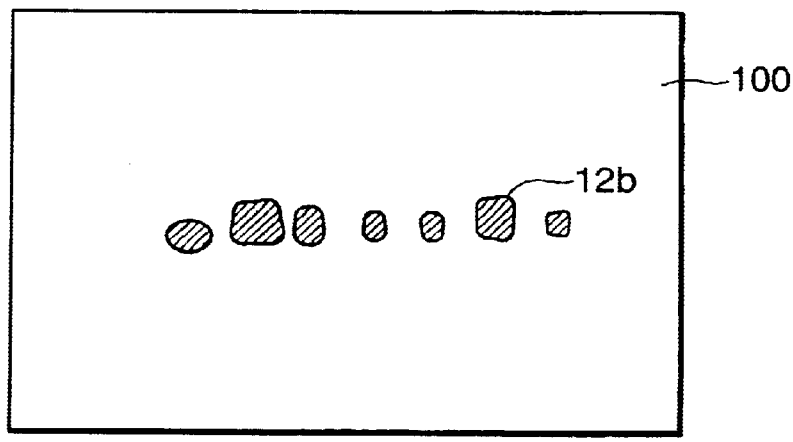

FIGS. 5 and 6 show how the droplets adhere to a conventional substrate. FIG. 5A is a cross section of when a plurality of droplets 12 are discharged onto a base 100, and FIG. 6A is a plan view thereof. If the droplets 12 are continuously discharged onto a base on which a pattern formation region has not been formed as in this embodiment, then upon impact the droplets 12 spread out as a result of surface tension, and adjacent droplets 12 join together as shown in FIG. 5A. Since there is no boundary whatsoever for impeding this spreading of the droplets 12, the profiles or the droplets spread out beyond the spreading that occurs upon impact, as shown in FIG. 6A. If the fluid has a low solvent content, it will solidify while its profile is still spread out, making it difficult to form a fine pattern. If the solvent content is high, the solvent component in the droplets will be removed when the droplets are dried, and the droplets will shrink in the position where they landed. Since there are no restrictions on the adhesion position, the droplets 12 that had initially linked together will split apart again and form islands 12b, as shown in FIGS. 5B and 6B. [A film] that splits up into the islands 12b will not work as a pattern.

The operation of the substrate 1a in the pattern formation region 10 of this embodiment will be described through reference to FIG. 4. FIG. 4A shows the form of the droplets on the substrate when droplets of fluid have adhered to the pattern in FIG. 2A. FIG. 4B shows the form of the droplets on the substrate when droplets of fluid have adhered to the pattern in FIG. 2G. For both of the patterns in FIGS. 4A and 4B, we will assume that the droplets are bonded along a line L3 by an ink jet method.

As shown in FIG. 4A, the droplets 12 that land on the substrate spread out sufficiently in the affinity regions 110. They are rejected, however, by the non-affinity regions 111, and are drawn into the adjacent affinity regions 110 through surface tension. Therefore, after they are thus drawn by the action of their surface tension, the droplets 12 only adhere to the affinity regions 110, as shown in FIG. 4A. Even though the direction in which the droplets are discharged from the head may vary somewhat, as long as the droplets 12 land in a specific width from lines L2 to L4, they will always adhere in the affinity regions 110 between lines L2 and L4. Since the affinity regions 110 are separated from one another, or only touch at points, the droplets 12 that are in a single affinity region 110 will not infiltrate adjacent affinity regions 110 unless they land directly thereon. Since affinity regions 110 bearing droplets 12 are always touching or just slightly away next to [other] affinity regions 110 bearing droplets 12, the droplets 12 link together through surface tension. Therefore, the droplets 12 link up along the path where they land, forming a contiguous pattern. Since the affinity regions 110 bearing droplets 12 are completely filled with droplets, adjacent droplets that have linked together do not separate when the droplets are dried.

As can be understood from the above, with the pattern formation region 10 formed as in this embodiment, the fluid spreads out sufficiently in the region to which it adheres, but spreads no further. In other words, just the right amount of fluid adheres. As to the pattern layout of the affinity regions 110, it is preferable for the individual patterns to be in point contact with one another. If the individual patterns are touching and linked completely, surface tension cannot be impeded at the affinity region boundaries, and there is the danger of uncontrolled infiltration by the droplets to adjoining affinity regions. Conversely, if the pattern spots are too far apart, this will impair the continuity of the droplets and lead to separation of the droplet pattern.

Meanwhile, with the linear pattern in FIG. 4B, the droplets 12 land along the line L3, and adjacent droplets 12 link up. With this linear pattern, as long as the droplets 12 land between lines L2 and L4, they will be absorbed into the linking of the droplets centered on line L3, and the droplets will not spread out beyond the width from line L2 to line L4. Since line L3 is continuous, there will be no interruption in the droplet pattern as long as the droplets 12 land so that they overlap.

When a pattern is formed using the substrate $1^{[2]}$ in this embodiment, any method that allows a fluid to adhere to the base surface can be applied. For instance, besides bonding by ink jet method, various coating methods such as spin coating, roll coating, die coating, and spray coating can also be applied. Because the substrate in this embodiment is structured such that a suitable amount of fluid will adhere, the fluid adheres evenly to the pattern formation region 10, but does not adhere to the pattern non-formation region 11, allowing the adhesion of the fluid to conform to the pattern. It is possible to form a thin film matching the pattern formation region by subjecting the adhering fluid to a heat treatment or the like to evaporate the solvent and produce a thin film.

As discussed above, this Embodiment 1 allows a suitable amount of fluid to adhere in the pattern formation region, and the fluid does not adhere in the pattern non-formation region, so it is possible to form a thin film matching the pattern formation region.

Embodiment 2

Embodiment 2 of the present invention relates to a method for manufacturing the substrate described in Embodiment 1 above, in which paraffin or another such organic substance was used.

The manufacturing method of this embodiment will be described through reference to FIG. 7. FIG. 7 illustrates the substrate manufacturing process of the present invention in cross sections.

Figure 7A:
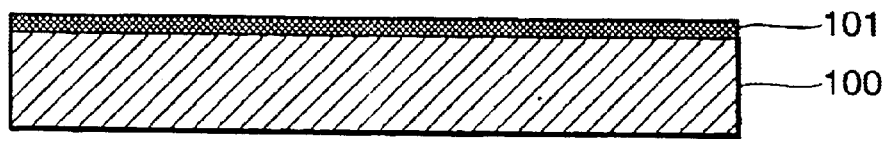
FIG. 7 is the method for manufacturing a substrate in Embodiment 2.
Figure 7B:
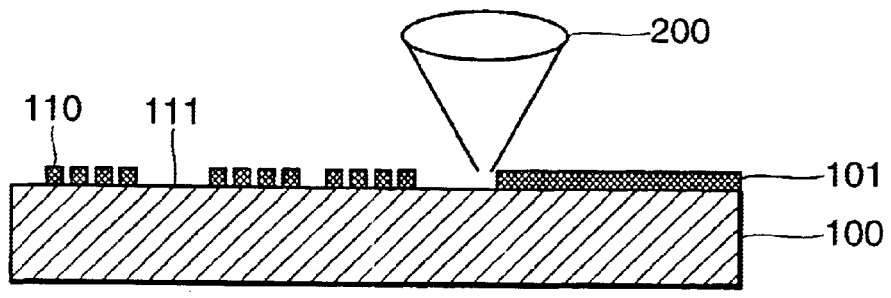
Figure 8A:
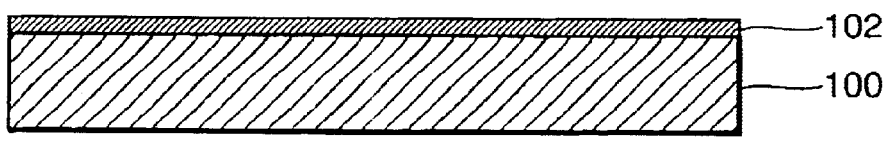
FIG. 8 is the method for manufacturing a substrate in Embodiment 3.
Figure 8B:
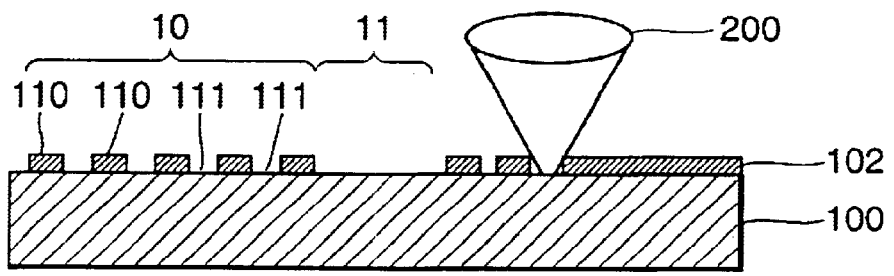
Figure 8C:
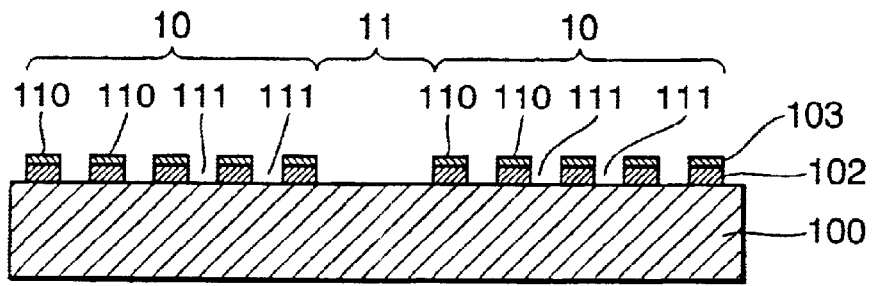

Paraffin layer formation step (FIG. 7A): The paraffin layer formation step is a step for forming a paraffin layer 101 by coating the base 100 with paraffin. The base 100 is selected according to the fluid, that is, based on whether is has an affinity or does not have an affinity (hydrophobic, lipophilic) to the fluid. If the fluid contains no polar molecules, then a hydrophilic base 100 is used. If the fluid contains polar molecules, then a hydrophobic material is selected for the base 100. FIG. 7 shows the pattern formation when the fluid contains no polar molecules, in which case a hydrophilic material is used for the base 100. For example, the base 100 is made from poly-4-vinylpyrrolidone, polyethylene oxide, polyvinyl alcohol, cellulose, polyvinyl acetate, or the like. Roll coating, spin coating, spray coating, die coating, bar coating, or various other coating methods, or various printing methods, transfer methods, or the like can be applied for the formation of the paraffin layer 101.

Energy supply stop (FIG. 7B): The mask formation step[3] is a step in which the paraffin is evaporated by supplying energy to that part of the paraffin layer 101 comprising the pattern non-formation region 11 and the non-affinity regions 111 in the pattern formation region 10 when the fluid contains no polar molecules. Three types of energy are possible: optical, thermal, and optical and thermal [together], but the use of laser light is preferred for removing paraffin from a specific fine region. The paraffin may be evaporated by being irradiated with short-wavelength laser light, for example.

The aforementioned manufacturing step enables the paraffin layer 101 to remain in the affinity regions 110 of the pattern formation region 10. Adhesion of a non-polar molecule-containing fluid to the substrate will occur only in the pattern formation region 10. When a fluid to be adhered contains polar molecules, then supplying energy only to the affinity regions 110 of the pattern formation region 10 will remove the paraffin. It is thereby possible to cause adhesion of polar molecule-containing fluids in the affinity regions 110 only.

If the base 100 is formed from a material that exhibits an affinity to the fluid, then it is manufactured so that the paraffin will remain in the pattern non-formation region 11 and in the non-affinity regions 111 of the pattern formation region 10. If the base 100 is formed from a material that exhibits no affinity to the fluid, then it is manufactured so that the paraffin will remain in the affinity regions 110 of the pattern formation region 10.

Embodiment 3

Embodiment 3 of the present invention relates to a method for manufacturing the substrate described in Embodiment 1 above. In particular, this embodiment involves the use of a self-aggregating single-molecule film of a sulfur compound.

Description of the General Principle

Figure 19A:
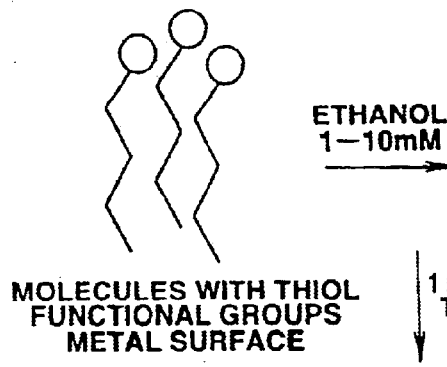
FIG. 19 is an explanatory drawing of the self-aggregation of a sulfur compound.
Figure 19B:
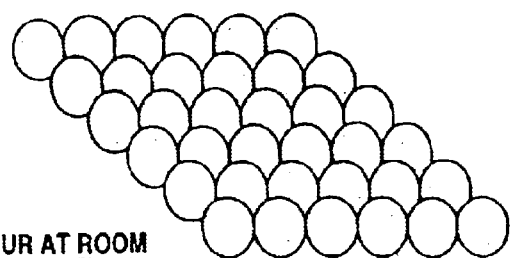
Figure 19C:
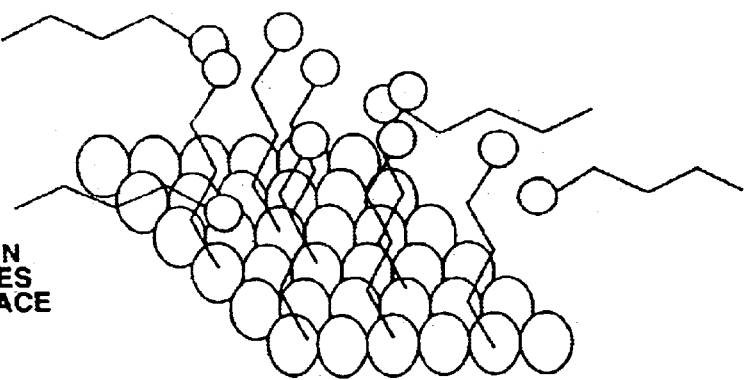
Figure 19D:
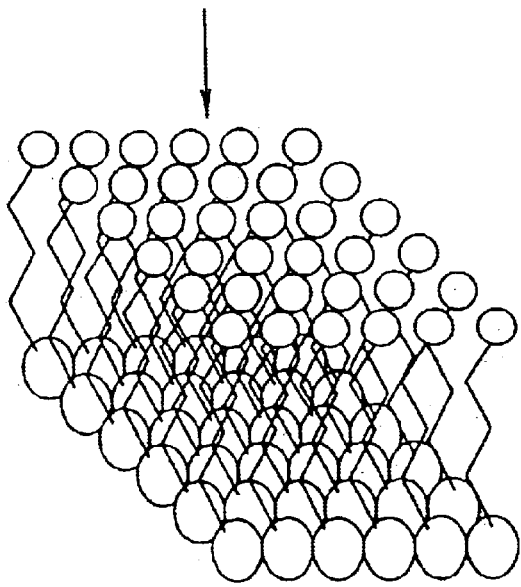

The general principle of self-aggregation when the sulfur compound is a thiol is described below with reference to FIG. 19. In this embodiment a metal layer is established on the substrate and this is immersed in a solution which contains the sulfur compound and a self-aggregating monomolecular film is formed. The thiol compound, as shown in FIG. 19(a), has part of the tail comprising a mercapto group. This is dissolved to provide a from 1 to 10 mM ethanol solution. When a film of metal, as shown in FIG. 19(b), is immersed in this solution and left to stand for about 1 hour at room temperature, the thiol compound aggregates spontaneously on the surface of the metal (FIG. 19(c)). Covalent bonding takes place between the metal atoms and the sulfur atoms and a mono-molecular film of thiol molecules is formed two-dimensionally on the surface of the metal (FIG. 19(d)). The thickness of this film is determined by the molecular weight of the sulfur compound but it is of the order of some 10 to 50 Å. It is possible by controlling the structure of the sulfur compound to provide the self-aggregating mono-molecular film with or without affinity for the fluid.

Thiol compounds are preferred for the sulfur compound. Here the term thiol compound signifies generally an organic compound (R—SH, where R is a hydrocarbyl group, such as an alkyl group) which has a mercapto group (—SH).

The structures of some typical thiol compounds are shown in Table 2 where they are divided into compounds for use when the fluid is hydrophilic and compounds for use when the fluid is lipophilic. In the table both "n" and "m" are natural numbers.

TABLE 2

| Subject | Fluid Which Contains Polar Molecules | Fluid Which Does Not Contain Polar Molecules |
|---|---|---|
| Composition of the Sulfur Compound | Sulfur compounds which have OH- groups or $CO_2H$ groups. For example, $HO_2C(CH_2)_nSH$ and $OH(CH_2)_nSH$ | Linear chain alkane-thiols which can be represented by $C_nH_{2n+2}SH$ and fluorine based compounds which can be represented by $CF_3(CF_2)_m(CH_2)_nSH$ |
| Composition of the Substrate | Poly(vinyl alcohol), poly(acrylic acid), nylon, glass | BAKELITE ™, polyester, polyethylene, TEFLON ™, PMMA, polypropylene, vinyl chloride |

It is clear from Table 2 that a mono-molecular sulfur compound film can be established freely as a hydrophilic or lipophilic film by changing the composition. A lipophilic substrate is selected when the sulfur compound is hydrophilic and a hydrophilic substrate is selected when the sulfur compound is lipophilic.

Method of Manufacture

Cross sectional drawings of the manufacturing process in the method of manufacture of embodiment 2 are shown in FIG. 20. The drawing shows cross sections corresponding to the aforementioned FIG. 14(b) or (c).

Figure 20A:
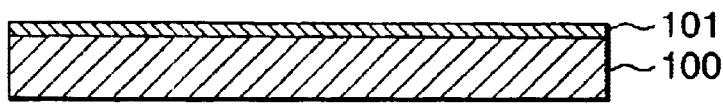
FIG. 20 is the method for manufacturing a substrate in embodiment 8.

The Metal Layer Formation Process (FIG. 20(a))

The metal layer 101 is formed on the substrate 100 in the metal layer forming process. The substrate 100 selected is either hydrophilic or lyophilic with respect to the fluid which is to be used. A metal layer 101 is established on the substrate 100. Gold (Au) is preferred for the metal layer because it is both chemically and physically stable. Other metals such as silver (Ag), copper (Cu), indium (In) and gallium-arsnic (Ga-As), for example, on which sulfur compounds are adsorbed chemically can also be used. Known techniques such as wet plating, vacuum vapor deposition and vacuum sputtering methods, for example, can be used to form the metal layer. No particular limitation is imposed upon the type of method provided that it can be used to form a uniform thin metal film of constant thickness. The role of the metal layer is to fix the sulfur compound layer and so the metal layer itself may be extremely thin. Consequently, in general it may be of thickness of some 500 to 2,000 Å.

Moreover, the bonding between the metal layer 101 and the substrate 100 may be poor, depending on the substrate 100. At such a time an intermediate layer may be formed between the substrate and the metal to improve the bonding between the metal layer 101 and the substrate 100. Such an intermediate layer is preferably a material which increases the bonding strength between the substrate 100 and the metal layer 101, such as nickel (Ni), chromium (Cr), tantalum (Ta), or an alloy of these metals (such as Ni—Cr for example). If an intermediate layer is established the bonding strength between the substrate 100 and the metal layer 101 is increased and the sulfur compound layer is unlikely to peel away even when mechanical rubbing is applied. When an intermediate layer is formed below the metal layer 101 it is formed with Cr, for example, by means of the vacuum sputtering method or the ion plating method to a thickness of from 100 to 300 Å.

Figure 20B:
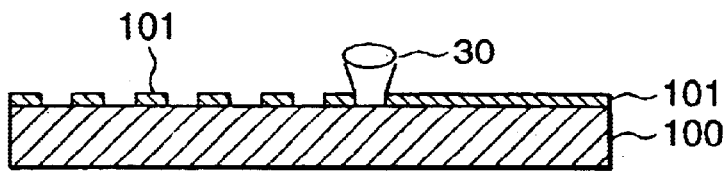

The Pattern Forming Process (FIG. 20(b))

In the pattern forming process energy is imparted to either the affinity regions or the regions which do not exhibit affinity of the metal layer 101 which has been formed on the substrate 100 and the metal is evaporated. Light is the preferred form of energy, and laser light where high energy can be supplied at short wavelengths is especially desirable. The pick-up 30 which radiates laser light is moved while radiating laser light in accordance with the pattern of the affinity region or the region which does not exhibit affinity. The metal which forms the metal layer 101 is evaporated from the regions irradiated with the laser light and so the substrate 100 is exposed. Moreover, the various patterns shown in Embodiment 1 can be used for the pattern.

Figure 20C:
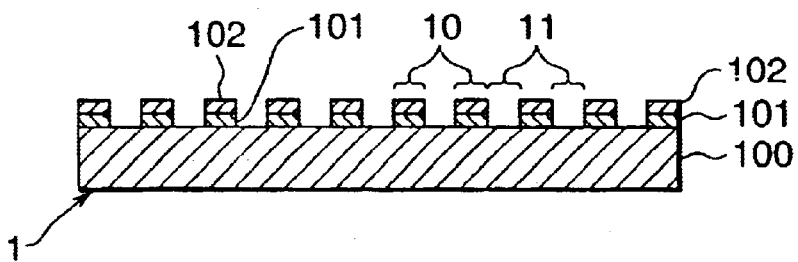

The Sulfur Compound Immersion Process (FIG. 20(c))

The substrate on which a pattern has been formed with the metal layer is immersed in a solution of the sulfur compound and a self-aggregating mono-molecular film 102 is formed in the sulfur compound immersion process. First or all the thiol compound which is to be used for the self aggregating mono-molecular film 102 is dissolved in an organic solvent such as ethanol or isopropyl alcohol to prepare a solution. A sulfur compound which has alkyl groups is used when a film which does not exhibit affinity is required and a sulfur compound which has —OH groups or —$CO_2H$ groups is used when a film which exhibits affinity is required. The substrate 100 on which the metal layer 101 has been formed is immersed in the solution. The immersion conditions are set to sulfur compound concentration in the solution 0.01 mM, solution temperature from normal temperature to about 50° C. and immersion time from 5 minutes to about 30 minutes. The solution is stirred or circulated during the immersion treatment so that the sulfur compound layer is formed uniformly.

If the metal surface is held still then the sulfur molecules undergo self-aggregation and a mono-molecular layer is formed, and so there is no need for strict process control. When immersion has been completed a mono-molecular layer of sulfur molecules which are strongly adsorbed has been formed on just the surface of the metal.

Finally the solution which is adhering to the substrate surface is rinsed away. The thiol molecules which are attached to parts other than the metal are not covalently bonded and so they can be removed by means of a simple rinse with ethyl alcohol, for example.

A substrate 1 of which the self-aggregated monomolecular film 102 is hydrophilic or non-hydrophilic and the exposed part of the substrate 100 is non-hydrophilic or hydrophilic is produced by means of the process described above. In a case where the fluid discharged onto the substrate is hydrophilic, the parts where the self-aggregated monomolecular film 102 form the affinity regions 10 and the exposed parts of the substrate 102 form the regions 11 which do not exhibit affinity, as shown in FIG. 20(c).

In the way described above, by means of embodiment 3 it is possible to manufacture a substrate which is suitable for industrial purposes with the ink-jet system by using a self-aggregating mono-molecular film of a sulfur compound. In particular, the self-aggregating mono-molecular film of sulfur compound is strong in respect of wear and has high physical and chemical resistance and so it is ideal for substrates which form industrial products. Furthermore, by selecting the sulfur compound it is also possible to provide freely a self-aggregating mono-molecular film which is hydrophilic or non-hydrophilic, according to the nature of the base. Moreover, if laser light is used it is possible to form fine patterns and so it is possible to form patterns which are suitable for retaining liquid droplets of the fluid by surface tension.

Embodiment 4

Embodiment 4 of the present invention relates to a method for manufacturing the substrate of Embodiment 1 by plasma treatment.

A plasma treatment involves the surface modification of a substrate by performing a high-voltage glow discharge under a specific atmospheric pressure. When an insulating substrate such as glass or plastic is subjected to a plasma treatments crosslinked layer and a large number of unreacted groups are generated on the substrate surface. When these are exposed to the air or an oxygen atmosphere, the unreacted groups are oxidized and form carbonyl groups or hydroxyl groups. Because these are polar groups, they have an affinity to a fluid containing polar molecules. On the other hand, most types of glass and plastic exhibit no affinity to a fluid containing polar molecules. Therefore, it is possible to produce affinity regions and non-affinity regions by selectively subjecting the pattern formation side of a substrate to a plasma treatment. This embodiment is based on this principle, and involves creating affinity regions and non-affinity regions by subjecting only part of the region to a plasma treatment by the use of a mask.

Figure 9A:
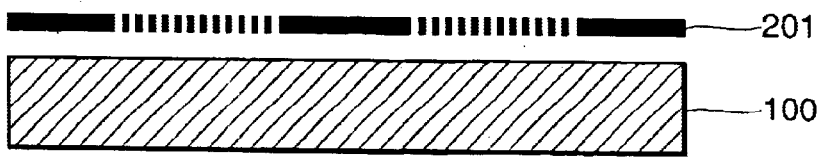
FIG. 9 is the method for manufacturing a substrate in Embodiment 4.
Figure 9B:
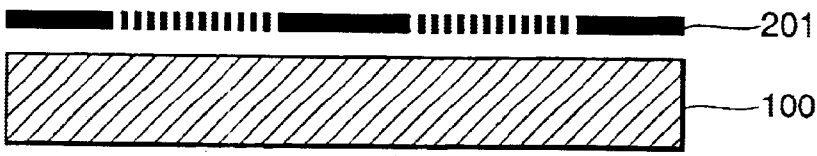
Figure 9C:
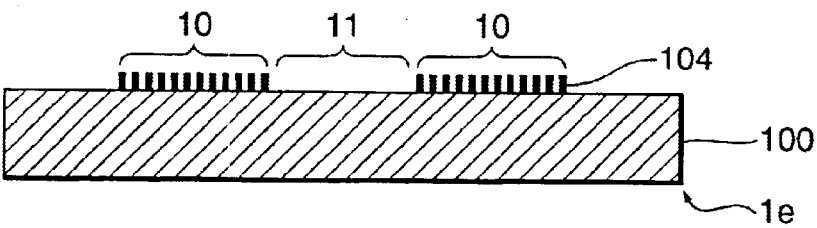

The substrate manufacturing method of Embodiment 4 will now be described through reference to FIG. 9.

Mask formation step (FIG. 9A): The mask formation step is a step in which a mask 201 is applied over the base 100. A material with which unreacted groups will appear upon irradiation with a plasma, [such as] a specific plastic, glass substrates whose surface has been coated with TEFLON™, and the like can be used as the base 100. The mask 201 is formed in a pattern such that the mask will cover only those regions of the base 100 that are to be made hydrophobic. For instance, when a fluid containing polar molecules is used, the mask is provided so that the pattern non-formation region 11 and the non-affinity regions 111 in the pattern formation region 10 will be exposed. The mask can be formed from a variety of materials, such as exposure masks, emulsion masks, and hard masks. When an exposure mask is used, it is formed from chromium, chromium oxide, silicon, silicon oxide an oxidation film, or the like by vacuum vapor deposition, sputtering, CVD, or another such process.

Plasma irradiation step (FIG. 9B): The plasma irradiation step is a step in which the base 100 to which the mask 201 has been applied is irradiated with a plasma 202. This plasma irradiation is carried out by glow discharge, in which a voltage of from several hundred to several thousand volts is applied using a neon transformer in argon gas of $10^{-1}$ to 100 Pa, for example. Other methods that can be applied include forming a discharge plasma by inductive coupling or capacity coupling using a discharge power source in the radio frequency band, and forming a discharge plasma by supplying microwave power to a discharge cell by waveguide.

This treatment generates ions, electrons, excited atoms or molecules, radicals, and so forth as active particles in the plasma, and changes the molecular structure of the surface of the base 100. In other words, a crosslinked layer and a large number of unreacted groups appear at the portion irradiated with the plasma 202.

Surface modification step (FIG. 9C): The surface modification step is a step in which the surface of the base 100, that has been plasma treated is modified through oxidation. The base 100, on which unreacted groups and a crosslinked layer have appeared as a result of the above-mentioned plasma treatment, is exposed to the air or an oxygen atmosphere. The unreacted groups on the base 100 surface are oxidized into polar groups 104, such as hydroxyl groups or carbonyl groups. These polar groups 104 are hydrophilic and therefore readily wetted by water. Meanwhile, the region that was masked and not plasma treated is not hydrophilic, being unmodified plastic.

Therefore, the regions that were plasma treated become the affinity regions 110, while the regions not plasma treated become the non-affinity regions 111 or the pattern non-formation region 11.

Thus, with this Embodiment 4, the molecular structure of part of the region that makes up the base is changed by plasma treatment, which allows a film with no affinity to be changed into a film with an affinity, so the substrate of Embodiment 1 can be provided without any new layer being formed. Because the composition is changed at the molecular level, this substrate is stable.

If the base 100 is formed from a material that exhibits an affinity to the fluid, then the manufacture involves the plasma irradiation of the pattern non-formation region 11 and the non-affinity regions 111 in the pattern formation region 10. If the base 100 is formed from a material that exhibits no affinity to the fluid, then the manufacture involves the plasma irradiation of the affinity regions 110 in the pattern formation region 10.

Embodiment 5

Embodiment 5 of the present invention relates to a method for manufacturing the substrate of Embodiment 1 by ultraviolet irradiation.

Ultraviolet irradiation can be used as a means for modifying the surface of a resin, just as the above-mentioned plasma treatment can. If the substrate is formed from a resin such as polyester or polyethylene, or if it is covered with a thin film of these resins, because these resins are organic macromolecules with no polarity, the surface thereof inherently has no affinity to a fluid containing polar molecules, but has an affinity to a fluid not containing polar molecules. However, if this resin surface is irradiated with ultraviolet rays, the surface is activated just as with the plasma treatment, and OH groups or COOH groups appear. These groups are polar groups, so [the surface] ends up exhibiting an affinity to a fluid containing polar molecules. Affinity regions and non-affinity regions can be easily formed by using a mask to selectively irradiate with ultraviolet rays part of the pattern formation side of the substrate.

Figure 10A:
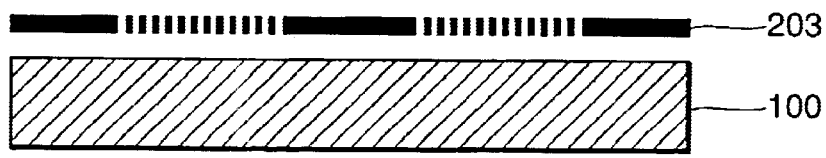
FIG. 10 is the method for manufacturing a substrate in Embodiment 5.
Figure 10B:
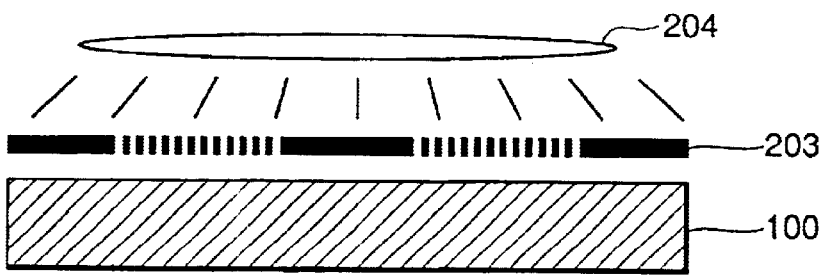
Figure 10C:
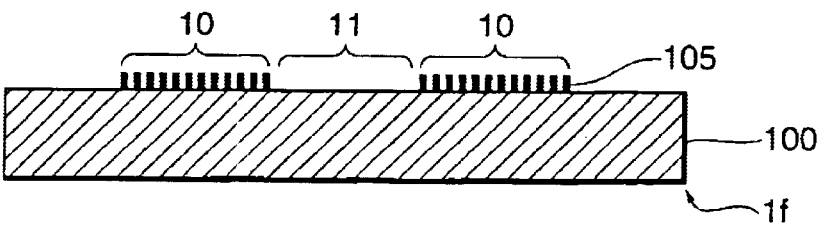
Figure 11A:
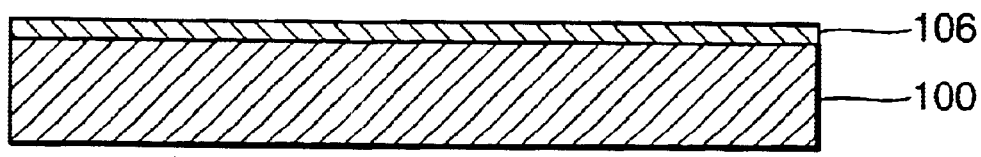
FIG. 11 is the method for manufacturing a substrate in Embodiment 6.
Figure 11B:
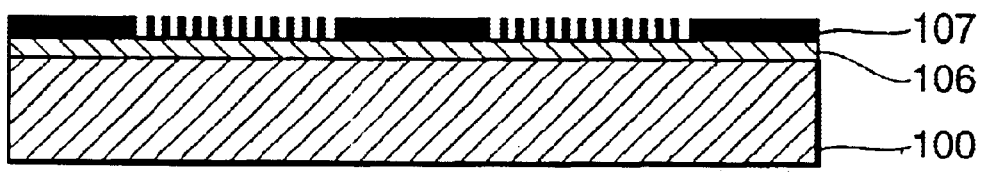
Figure 11C:
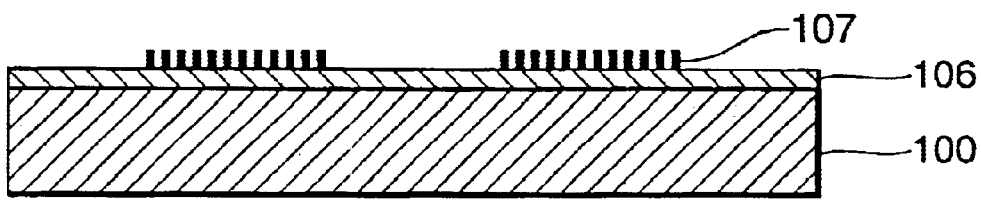
Figure 11D:
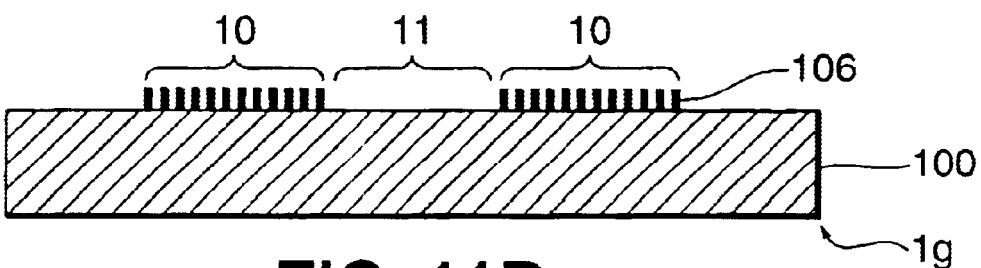
Figure 12A:
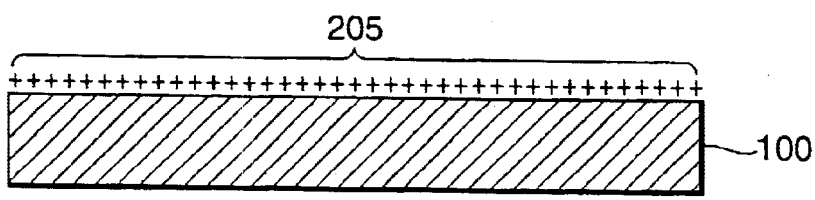
FIG. 12 is the method for manufacturing a substrate in Embodiment 7.
Figure 12B:
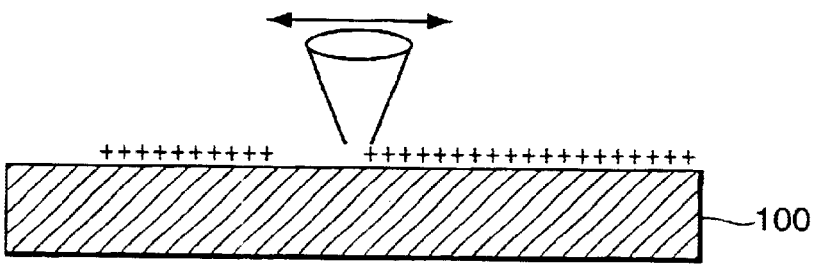
Figure 12C:
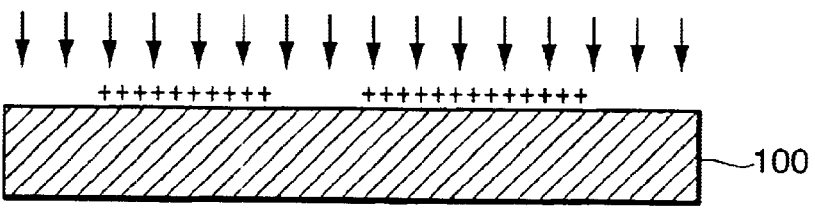
Figure 12D:
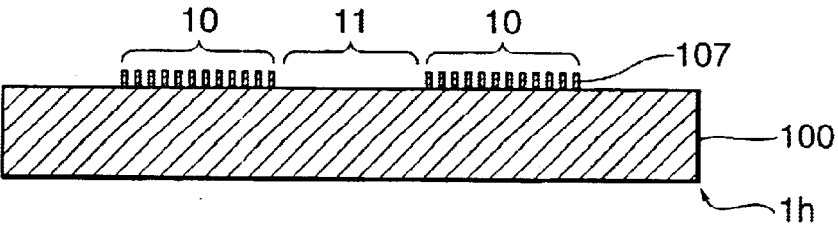

The substrate manufacturing method of Embodiment 5 will now be described through reference to FIG. 10.

Mask formation step (FIG. 10A): The mask formation step is a step in which a mask 203 is applied over the base 100. A material with which unreacted groups will appear upon irradiation with a plasma, and particularly a plastic such as polyester or polyethylene, is used as the base 100. A substrate such as glass on whose surface is formed a thin film of one of these plastics can also be used. The mask 203 is formed in a pattern such that the mask will cover only those regions of the base 100 that are to be made hydrophobic. For instance, when a fluid containing polar molecules is used, the mask is provided so that the affinity regions 110 in the pattern formation region 10 will be exposed and all other regions will be covered. The mask can be formed from a variety of materials, such as exposure masks, emulsion masks, and hard masks. When an exposure mask is used, it is formed from chromium, chromium oxide, silicon, silicon oxide, an oxidation film, or the like by vacuum vapor deposition, sputtering, CVD, or another such process.

Ultraviolet irradiation step (FIG. 10B): The ultraviolet irradiation step is a step in which the base 100 to which the mask 203 has been applied is irradiated with ultraviolet rays. An ultraviolet lamp, for example, is used to perform this ultraviolet irradiation. This treatment excites the molecules and changes the covalent bond structure by applying energy in the form of ultraviolet rays 204 to the macromolecular surface of the base 100. As a result, a large number of unreacted groups and a crosslinked layer appear in the exposed region of the base 100 irradiated with these ultraviolet rays 204.

Surface modification step (FIG. 10C): The surface modification step is a step in which the surface of the base 100 that has undergone ultraviolet irradiation is modified through oxidation. When the base 100, on which unreacted groups and a crosslinked layer have appeared as a result of the above-mentioned irradiation with the ultraviolet rays 204, is exposed to the air or an oxygen atmosphere, the unreacted groups on the base 100 surface are oxidized into polar groups 105, such as hydroxyl groups or carbonyl groups. These polar groups 104 have an affinity to a fluid such as water t hat contains polar molecules ([i.e., the groups are] hydrophilic) and therefore readily wetted by water. Meanwhile, the region that was masked and not exposed retains its properties as a plastic. In other words, it exhibits no affinity to a fluid containing polar molecules. Therefore, the regions that underwent ultraviolet irradiation become the affinity regions 110, while the regions that did not undergo ultraviolet irradiation become the non-affinity regions 111 or the pattern non-formation region 11.

Thus, with this Embodiment 5, the molecular structure of part of the region that makes up the base is changed by ultraviolet irradiation, which allows a film with no affinity to be changed into a film with an affinity, so the substrate of Embodiment 1 can be provided without any new layer being formed. Because the composition is changed at the molecular level, this substrate is stable.

If the base 100 is formed from a material that exhibits an affinity to the fluid, then the manufacture involves the ultraviolet irradiation of the pattern non-formation region 11 and the non-affinity regions 111 in the pattern formation region 10. If the base 100 is formed from a material that exhibits no affinity to the fluid, then the manufacture involves the ultraviolet irradiation of the affinity regions 110 in the pattern formation region 10.

Embodiment 6

Embodiment 6 of the present invention relates to a method for manufacturing the substrate of Embodiment 1 by photolithography.

The substrate manufacturing method of Embodiment 6 will now be described through reference to FIG. 11. In the following description, we will assume that the base 100 exhibits no affinity to the fluid, and a layer that exhibits an affinity to the fluid is formed by photo-lithography in the affinity regions 110 in the pattern formation region 10. However, if the base 100 does exhibit an affinity to the fluid, then a layer that exhibits no affinity to the fluid is formed by photolithography in the pattern non-formation region 11 and in the non-affinity regions 111 in the pattern formation region 10.

Affinity film formation step (FIG. 11A): The affinity film formation step is a step in which a thin film 106 is formed on the base surface from a material that exhibits an affinity to the fluid. Examples of thin film materials that exhibit an affinity to a fluid containing polar molecules include silane coupling agents having OH groups, COOH groups, $NH_2$ groups, and so on. Spin coating, dipping, or another known thin film formation method can be employed as the method for forming this thin film. The thin film 106 should be thick enough that it can be formed in a more or less uniform thickness by the above-mentioned manufacturing methods.

Exposure step (FIG. 11B): The exposure step is a step in which the thin film 106 is coated with a photoresist 107 and masked according to the pattern formation, after which this is exposed and developed to leave behind the photoresist 107. The photoresist can be a known material such as PMMA, PBS, or polyimide, and is determined by the relation between the etching method and the thin film material 106. After the photoresist 107 has been applied by a coating method such as spinning, spraying, roll coating, or dipping, masking is performed in the same manner as described in Embodiment 4 or 5 above, and the photoresist 107 is exposed. If the photoresist is a positive type, the mask covers the affinity regions 110 in the pattern formation region 10. If the photoresist is a negative type, the mask covers the pattern non-formation region 11 and the non-affinity regions 111 in the pattern formation region 10. The photoresist is exposed from above the mask by exposure to ordinary light or far ultraviolet rays.

Developing step (FIG. 11C): The developing step is a step in which the photoresist 107 is left behind in a pattern by developing the exposed photoresist. This developing is accomplished by causing a developer to adhere through spraying, dipping, or another such method. Next, a rinse liquid is made to adhere by the same method to remove any unnecessary photoresist. This treatment leaves behind the photoresist 107 along the pattern on the thin film 106.

Etching step (FIG. 11D): The etching step is a step in which the thin film 106 and its remaining photoresist 107 are etched to remove any unnecessary thin film 106. The etching liquid (in the case of wet etching) or etching gas (dry etching) is selected to be suited to the etching of the thin film 106, which is the material being etched.

The above step removes the thin film 106 from everywhere except the affinity regions 110 in the pattern formation region 10, and forms the pattern formation region 10 and the pattern non-formation region 11 on the base 100 surface.

As discussed above, with this Embodiment 6, it is also possible to manufacture the substrate of Embodiment 1 by photolithography, which is commonly used as a thin film pattern formation method.

If the base 100 is formed from a material that exhibits an affinity to the fluid, then the manufacture involves leaving a thin film that exhibits no affinity in the pattern non-formation region 11 and the non-affinity regions 111 in the pattern formation region 10. If the base 100 is formed from a material that exhibits no affinity to the fluid, then the manufacture involves leaving a thin film that exhibits an affinity in the affinity regions 110 in the pattern formation region 10.

Embodiment 7

Embodiment 7 of the present invention relates to a method for manufacturing the substrate of Embodiment 1 by application of a charge to the substrate.

FIG. 12 illustrates the substrate manufacturing process in this Embodiment 7 in cross sections.

Charge application step (FIG. 12A): The charge application step is a step in which a charge is generated on the base 100. A material that lends itself to charging is used for the base 100. For example, if the material is a polymer, polyethylene terephthalate can be used. It is also possible to use PVK/Se, PVK-TNF, CFL/CTL, CTL/CGL, CTL (CGL), or the like, or an inorganic semiconductor based on selenium, Si:H, CdS, ZnO, or the like, which are used as photosensitive materials in laser printers. A charge application means such as a corona charger used in a laser printer is used in order to apply a charge 205 to the base 100 surface. The substrate surface is uniformly charged by bringing the corona charger or other charge application means into proximity therewith. In specific terms, a DC high voltage of 6 to 8 kV is applied to a tungsten wire with a diameter of 50 to 100 $\mu$m, and corona discharge is performed 8 to 10 mm away from the base surface.

Decharging step (FIG. 12B): The decharging step is a step in which energy 206 is selectively applied to the pattern formation side of the uniformly charged base 100 so as to partially release the charge 205. Specifically, when optical energy or the like is supplied, optical carriers are produced and transport occurs in the exposed area, the surface charge is lost, and an electrostatic latent image is formed on the surface. Laser light is preferable as the energy supply source. This is because a latent image can be formed in a finer pattern. In addition, ultraviolet rays or other such optical energy may be added using a mask. When polyethylene terephthalate is used as the material for the base 100 as mentioned above, the decharged regions are the pattern non-formation region 11 and the non-affinity regions 111 in the pattern formation region 10.

Bonding step (FIG. 12C): The bonding step is a step in which electrostatic attraction is utilized to bond a powder material 107[4] to the charged region that was not decharged. This powder material 107 is a material such as a toner for a laser printer, for instance, and a material that can be bonded by electrostatic force is used. The material used here becomes a surface that exhibits an affinity to a fluid containing polar molecules after fixing. This material can be steel, glass beads, iron powder, one of these that has been coated with a resin, a mixture of a magnetic material and a resin, or the like. In specific terms, the powder material 107, which has the opposite polarity from that of the charged region on the base 100, adheres by electrostatic force to the region where the charge 205 is present.

Fixing step (FIG. 12D): The fixing step is a step in which the powder material 107 adhering to the base 100 surface is fixed. Once the powder material 107 adheres to the charged region of the base 100 due to the above-mentioned electrostatic force, heat is applied to the base 100 to melt the powder material 107 and fix it to the base 100. As a result, the affinity regions 110 are formed by the fixing of the powder material in the pattern formation region 10.

As discussed above, with this Embodiment 7, the substrate of Embodiment 1 comprising affinity regions and non-affinity regions can be manufactured by charging a substrate and fixing a powder material.

If the base 100 is formed from a material that exhibits an affinity to the fluid, then the manufacture involves leaving a thin film of a powder material that exhibits no affinity in the pattern non-formation region 11 and the non-affinity regions 111 in the pattern formation region 10. If the base 100 is formed from a material that exhibits no affinity to the fluid, then the manufacture involves leaving a thin film of a powder material that exhibits an affinity in the affinity regions 110 in the pattern formation region 10.

Embodiment 8

Embodiment 8 of the present invention relates to a manufacturing method in which a film is formed directly on a base by using a printing technique.

Figure 13A:
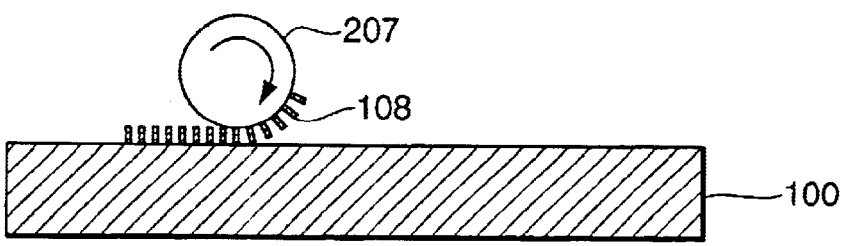
FIG. 13 is the method for manufacturing a substrate in Embodiment 8.
Figure 13B:
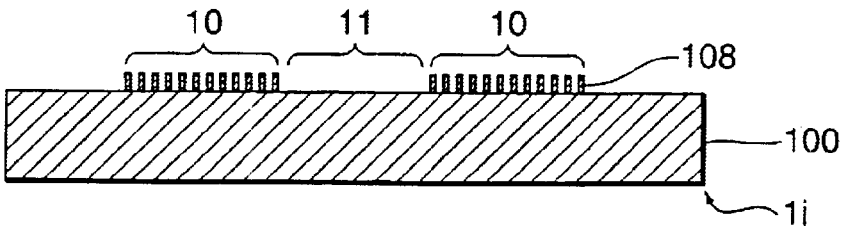

FIG. 13 illustrates the substrate manufacturing process in this Embodiment 8 in cross sections. FIG. 13 serves to illustrate the manufacturing method when offset printing, which is a type or lithography, is utilized, for example.

Printing step (FIG. 13A): The printing step is a step in which a film having an affinity to the fluid, or a thin film with no affinity, is formed by a specific printing method. The printing apparatus must be one with which a hard substance such as a substrate can be printed. The difference from conventional printing is the use of a material that forms an affinity region or non-affinity region of the present invention instead of ink. If the 100 exhibits no affinity to a fluid containing polar molecules, the material 108 is bonded by this printing apparatus to just the affinity regions 110 in the pattern formation region 10. If the 100 exhibits an affinity to a fluid containing polar molecules, the material 108 is bonded by this printing apparatus to the pattern non-formation region 11 and to the non-affinity regions 111 in the pattern formation region 10. In the figure, only the transfer roll 207 is depicted out of the entire offset printing apparatus. The thin film material 108 is transferred from the transfer roll 207 to the pattern formation side of the base 100. The printing method is not limited to offset printing, and can instead be direct printing or another lithographic method, or relief printing, intaglio printing, screen printing, a method that makes use of static electricity or magnetism, or the like. Specifically, any printing method with which a thin film material can be bonded instead of ink to a base by a known printing method can be applied.

Fixing step (FIG. 13B): Once the thin film material has been transferred to the base 100, a heat treatment or other known technique is applied in order to stabilize the thin film material 108. This step allows the manufacture of a substrate on which a thin film is formed only in the affinity regions 110 in the pattern formation region 10.

As discussed above, with this Embodiment 8, the substrate of Embodiment 1 can be manufactured by utilizing a known printing method to bond a thin film material.

If the base 100 is formed from a material that exhibits an affinity to the fluid, then it is printed with a thin film exhibiting no affinity in the pattern non-formation region 11 and in the non-affinity regions 111 in the pattern formation region 10. If the base 100 is formed from a material that exhibits no affinity to the fluid, then it is printed with a thin film exhibiting an affinity in the affinity regions 110 in the pattern formation region 10.

Embodiment 9

Embodiment 9 of the invention concerns a method for the manufacture of substrates as described above using copolymer compounds.

Description of the General Principle

The term copolymer compound signifies a polymer compound obtained using two or more types of monomer and in which they are included as components. In this embodiment at least one of the monomers selected is a material which exhibits affinity for the fluid, and the other monomer selected is a material which does not exhibit affinity for the fluid. The copolymer has a lamella structure with a plurality of monomers forming blocks of one or more than one molecule. A lamella structure is formed by accumulating plate-like blocks in accordance with a fixed rule. The molecules which form the block units exhibit affinity or not do exhibit affinity, and so if the copolymer compound is arranged and fixed on one side of a base it provides a substrate structure of this invention where fine affinity regions and regions which do not exhibit affinity are disposed on a substrate.

Examples of copolymer compound structures which can be used in this embodiment are shown in Table 3.

TABLE 3

| Monomers which Exhibit Hydrophilic Properties | Monomers which Exhibit Non-hydrophilic Properties |
| --- | --- |
| 4-Vinylpyrrolidone, Ethylene Oxide, Vinyl Alcohol, Cellulose, Vinyl Acetate | Styrene, Propylene Oxide, Butadiene |

Method of Manufacture

The method or manufacture in this embodiment is described below with reference to FIG. 21.

Figure 21A:
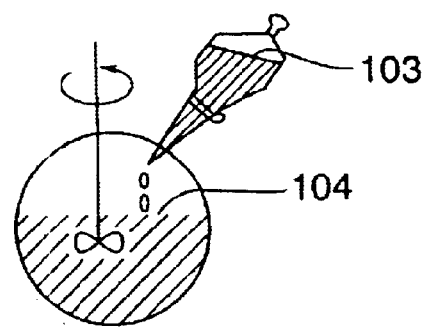
FIG. 21 is the method for manufacturing a substrate in embodiment 9.

The Copolymer Compound Mixing Process (FIG. 21(a))

First of all a monomer which exhibits hydrophobic properties is polymerized by means of ionic polymerization and a hydrophobic polymer 104 of suitable molecular,weight is obtained. The hydrophilic monomer 103 is then introduced into this polymer 104 and polymerized and the block copolymer 105 comprising hydrophilic parts and hydrophobic parts is obtained. Buyl-lithium or naphthalene sodium is used as a catalyst. THF is used as the solvent.

Figure 21B:
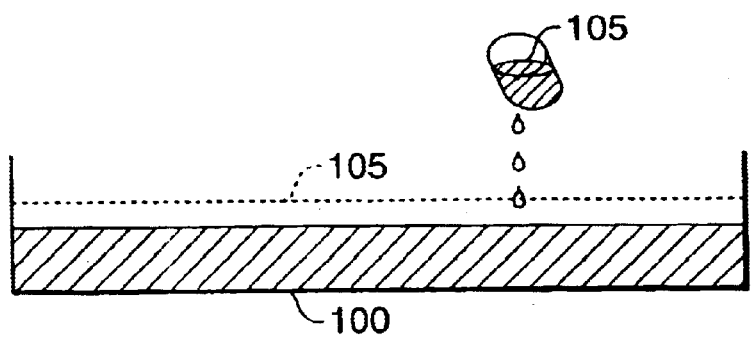

The Coating Process (FIG. 21(b))

A solution (for example trichloroethylene solution) 105 of the block copolymer obtained in the aforementioned process is poured by decantation over the base 100. The solvent is then removed and the unit is dried by being left to stand.

Moreover, in this embodiment the base 100 is not in direct contact with the fluid which is discharged by the ink-jet system and so any material can be used for the base irrespective of whether it exhibits affinity or does not exhibit affinity provided that it has a given mechanical strength.

Moreover, the copolymer compound layer can also be formed using a thin film polymer growth method, such as a plasma polymerization method. The plasma polymerization method involves using a gaseous mixture of the monomer which provides affinity and the monomer which does not provide affinity. This gaseous mixture is activated with a glow discharge and a polymer film is formed on the base 100. Plasma polymerization equipment is used to produce the copolymer compound layer. The gas flow rate, the gas pressure, the discharge frequency and the discharge power are set as plasma polymerization conditions to match the gaseous mixture.

According to Embodiment 9 described above a copolymer compound is used and so a substrate of this invention can be manufactured in accordance with the fine lamella structure at the fine molecular level. This substrate can be provided with affinity regions and regions which do not exhibit affinity arranged at random by simply producing and coating the copolymer compound and so the manufacturing process is simple and costs can be reduced.

Embodiment 10

Embodiment 10 of the invention concerns a method for the manufacture or substrates as described above using an organic material such as a paraffin.

The Method of Manufacture

The method of manufacture in this embodiment is described below with reference to FIG. 22.

Figure 22A:
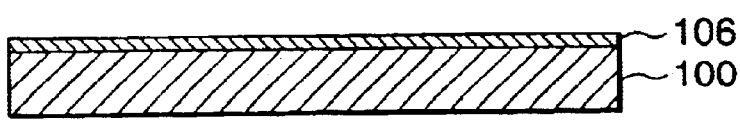
FIG. 22 is the method for manufacturing a substrate in embodiment 10.
Figure 22B:
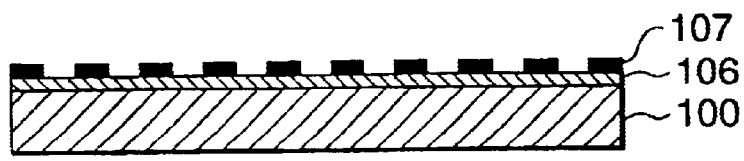
Figure 22C:
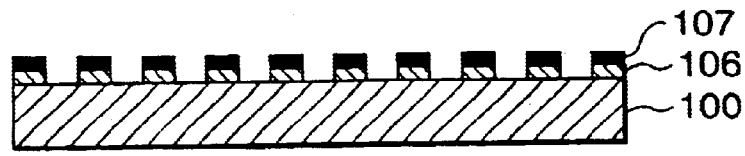
Figure 22D:
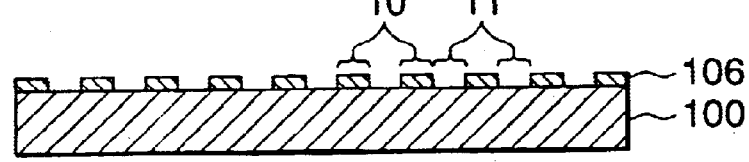

The Paraffin Layer Formation Process (FIG. 22(a))

The paraffin layer 106 is formed by coating paraffin onto the base 100 in the paraffin layer formation process. Paraffin is not hydrophilic and so a hydrophilic composition is used for the base 100. For example, 4-vinylpyrrolidone, ethylene oxide, vinyl alcohol, cellulose or vinyl acetate is used. The paraffin coating can be carried out using a coating method, for example a roll coating method, spin coating method, spray coating method, die coating method or bar coating method, or by using any of the various printing methods and transfer methods.

The Mask Formation Process (FIG. 22(*b*))

The mask 107 is formed on the paraffin layer 106 in the mask formation process. The mask 107 forms a pattern such that the non-hydrophilic regions are covered by the mask. Various mask materials can be used to form an exposed mask, an emulsion mask or a hard mask for example. When an exposed mask is used, a chromium, chromium oxide, silicon, silicon oxide or oxide film, for example, can be formed using a vacuum vapor deposition method, by sputtering on with a CVD method for example. Moreover, various patterns such as those indicated in Embodiment 1 can be used for the mask pattern.

The Energy Imparting Process (FIG. 22(*c*))

Energy is imparted to the paraffin layer 106 on which the mask 107 has been formed in the energy imparting process and the paraffin in the regions which are not covered by the mask are removed. Light, heat or light and heat can be considered for the energy, but the use of light is preferred for removing the paraffin in specified fine regions. For example, short wavelength laser light is radiated from above the mask 107 and the exposed paraffin is vaporized.

The Mask Removal Process (FIG. 22(*d*))

The mask 107 is removed in the mask removal process. The known organic solvents are used to remove the mask 107.

With this manufacturing process the paraffin layer 106 forms the regions 10 which are not hydrophilic (which do not exhibit affinity) and the regions where the base 100 is exposed form hydrophilic regions (which do not exhibit affinity). Moreover, when the fluid which is discharged from the ink-jet type recording head is lipophilic the paraffin layer 106 forms the affinity regions and the base 100 forms the regions which do not exhibit affinity.

By means of Embodiment 10 described above it is possible to manufacture a substrate of this invention using paraffin.

Embodiment 11

Embodiment 11 of this invention concerns the manufacture of a substrate by means of a plasma treatment.

Description of the General Principles

Plasma treatment is a treatment where the surface modification or a substrate is achieved by means of a high voltage glow discharge at a prescribed low pressure. When an insulating substrate such as glass or plastic has been subjected to a plasma treatment there are many unreacted groups and a crosslinked layer at the substrate surface and, on standing in air or in an oxygen atmosphere, the unreacted groups are oxidized to form carbonyl groups and hydroxyl groups. These are polar groups and so they are hydrophilic. On the other hand, glass and many plastics do not exhibit hydrophilic properties. It is therefore possible to form hydrophilic regions and non-hydrophilic regions by means of localized plasma processing.

Method of Manufacturing

The method of manufacture in this embodiment is described below with reference to FIG. 23.

Figure 23A:
FIG. 23 is the method for manufacturing a substrate in embodiment 11.
Figure 23B:
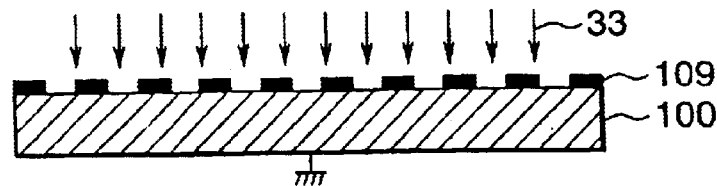
Figure 23C:
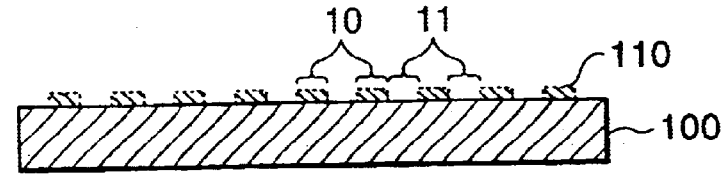

The Mask Formation Process (FIG. 23(*a*))

The mask 109 is formed in the base 100 in the mask formation process. A material on which unreacted groups are formed on plasma irradiation, such as a prescribed plastic or glass of which the surface has a TEFLON™ finish, is used for the base 100. The mask 109 is formed on the base 100 in a pattern so that only the regions which are to be non-hydrophilic are masked. Various mask materials can be used to form an exposed mask, an emulsion mask or a hard mask for example. When an exposed mask is used, a chromium, chromium oxide, silicon, silicon oxide or oxide film, for example, can be formed using a vacuum vapor deposition method, by sputtering, or with a CVD method foe example, Moreover, various patterns such as those indicated in Embodiment 1 can be used for the mask pattern.

The Plasma Irradiation Process (FIG. 23(*b*))

Plasma irradiation 33 is carried out over the base 100 on which the mask 109 has been formed in the plasma irradiation process. For example, a glow discharge is established by applying a voltage ranging from a few hundred to a few thousand volts using a neon lamp in an argon atmosphere at a pressure of from $10^{-1}$ to 100 Pa. Alternatively, a method in which a discharge plasma is formed by capacity coupling or induction coupling using a radio frequency discharge power supply or a method in which a discharge plasma is formed by supplying microwave power to a discharge chamber by means of a waveguide, for example, can be used.

Ions, electrons, excited atoms or molecules and radicals, for example, are generated as the active particles in the plasma by such a process and the molecular structure of the polymer at the surface of the base 100 is changed. Many unreacted groups and a crosslinked layer are formed in the parts which are irradiated by the plasma 33.

The Plasma Modification Process (FIG. 23(*c*))

The plasma irradiated base 100 surface is oxidized in the surface modification process and the surface is modified. The base 100 on which the unreacted groups and crosslinked layer have been formed by plasma irradiation are exposed to air or an oxygen atmosphere. The unreacted groups at the surface of the base 100 are oxidized and hydroxyl groups and carboxyl groups are produced. These polar groups are easily wet with water and exhibit hydrophilic properties. On the other hand, the masked regions which have not been treated with plasma remain as the plastic and exhibit non-hydrophilic properties.

Hence the plasma treated regions form the affinity regions 10 and the regions which have not been plasma treated form the regions 11 which do not exhibit affinity.

In this way, according to Embodiment 11 it is possible by modifying the molecular structure of some regions of a substrate by means of a plasma treatment to change a non-hydrophilic film into a hydrophilic film and so it is possible to provide a substrate without forming a new film. This substrate is stable because the constitution has been changed at the molecular level.

Moreover, a non-hydrophilic film can be converted to a hydrophilic film by irradiation with ultraviolet radiation instead of plasma irradiation.

Embodiment 12

Embodiment 12 is the manufacture of a substrate of Embodiment 1 by imparting an electrical charge to the substrate.

Method of Manufacture

The method of manufacture in this embodiment is described below with reference to FIG. 24.

Figure 24A:
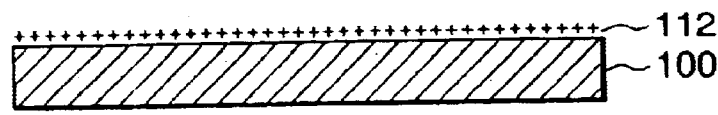
FIG. 24 is the method for manufacturing a substrate in embodiment 12.

Electrical Charge Application Process (FIG. 24(*a*))

The surface or the base 100 is modified and an electrical charge is produced in the electrical charge application process. Polyethylene terephthalate is used for the base 100. A corona discharge is used to apply the charge 112 to the surface of the base 100.

Figure 24B:
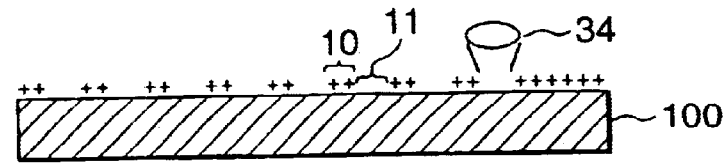

The Charge Elimination Process (FIG. 24(b))

The charge which has been applied to the base 100 is eliminated in the charge elimination process. Energy is supplied to the surface of the base 100 in order to achieve charge elimination. For example, the laser light 34 is radiated to match the pattern of affinity regions or regions which do not exhibit affinity as shown in Embodiment 1. The charge is eliminated from the regions on the base 100 which are subjected to irradiation.

Figure 24C:
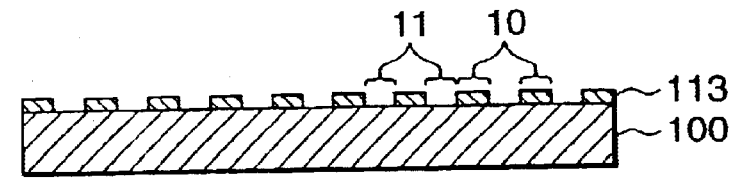

The Film Formation Process (FIG. 24(c))

The film 114 is formed on the surface of the base 100 in the film formation process. A resin powder, for example, comprising fine particles is charged electrostatically and then sprinkled over the surface of the base 100 and a film is formed on the base 100 surface. Either the base 100 may have an affinity for the fluid medium while the film 113 does not exhibit such affinity, or alternatively the base 100 may have no such affinity while the film 113 exhibits affinity.

Moreover, it is possible to manufacture substrates which have a pattern which exhibits affinity and a pattern which does not exhibit affinity by subjecting a paint film to a corona discharge. First of all a comb-toothed electrode is used for one electrode and a flat electrode is used for the other electrode for producing the corona discharge. If a paint film is then passed between the two electrodes the paint film is electrostatically charged in the form of stripes or dots. A pattern is then formed when a charged ink is spread over the paint film. If the ink is hydrophilic then the paint film is hydrophobic and so it is possible to use the paint film after spreading the ink as a substrate of the present invention.

In this way, by means of Embodiment 12 it is possible to manufacture a substrate by providing affinity regions and regions which do not exhibit affinity by subjecting a substrate to charge elimination.

Embodiment 13

Embodiment 13 of the invention is a method for forming a film directly on a base.

Method of Manufacture

The method of manufacture in this embodiment is described below with reference to FIG. 25.

Figure 25A:
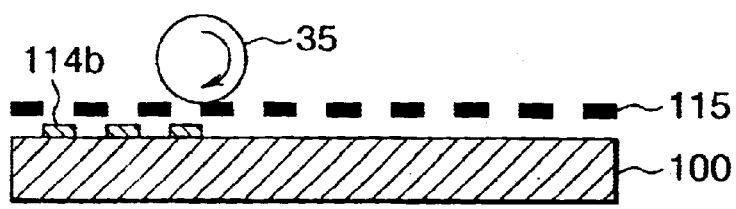
FIG. 25 is the method for manufacturing a substrate in embodiment 13.

The Printing Process (FIG. 25(a))

A film which has an affinity for the fluid or a film which has no such affinity is formed by means of a prescribed printing method in the printing process. When a material which has no affinity for the fluid which is discharged from the ink-jet type recording head is used for the film material 114b which is coated on the base 100, the base 100 comprises a material which does exhibit affinity. When a material which exhibits an affinity for the fluid is used for the film material 114b, the base 100 comprises a material which does not exhibit affinity. A method in which the film material 114b is coated with a roller 35 using a plate 115 in which a pattern which corresponds with the regions which exhibit affinity or the regions which do not exhibit affinity has been established, pressure is applied and the film material on the plate 115 is projected onto the base 100 is adopted for the printing method. The plate 115 may be a relief plate, a lithographic plate, an intaglio plate, a perforated plate or a plate with which static electricity or magnetism is used, depending on its form. That is to say, any of the known printing methods can be adopted as the method of printing by using the film material instead of ink.

Furthermore, rubbing methods where the top of the substrate 100 is rubbed and the film material is attached unevenly can also be used as a brushing method. The plate 115 is unnecessary with the rubbing method.

Figure 25B:
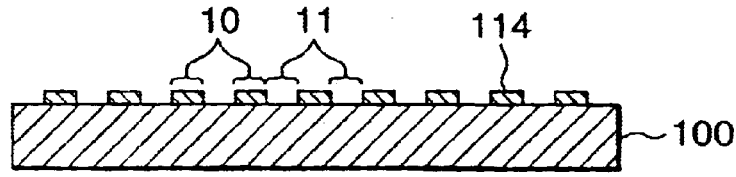

The Fixing Method (FIG. 25(b))

After the film material 114b has been transferred onto the base 100 the film material 114 is stabilized using a known technique such as heat treatment and the film 114 is formed.

In this way, by means of Embodiment 13 it is possible to manufacture a substrate as shown in Embodiment 1 with a method in which material is attached directly to a base.

Other Variations

The present invention is not limited to the above embodiments, and many other variations are also possible.

The patterns shown in Embodiment 1 are simple examples of patterns which can be established on a substrate, and the pattern is not limited to these patterns and can be varied in various ways. The size, shape and arrangement of a dot-like pattern or a line-like pattern can be changed in various ways. This is because these elements are determined in accordance with the nature or the fluid.

Furthermore, the method by which the substrate is manufactured is not limited to those of Embodiments 2 to 13 above, and various modifications are possible provided that [the substrate] is ultimately divided into affinity regions and regions which do not exhibit affinity.

Moreover, methods involving the use of silane coupling agents, methods involving the formation of porous films of aluminum oxide or silica for example, methods involving blocking with a water-absorbent organic film such as PVA, methods involving reverse sputtering in argon for example, and other known methods involving corona discharge, ultraviolet irradiation, ozone treatment and degreasing treatments, for example, can be used as means of surface treatment for changing parts of a non-hydrophilic substrate into hydrophilic parts.

Other Variations

The present invention is not limited to the above embodiments, and many other variations are also possible.

For instance, the disposition of the affinity region and the pattern shapes in which the base is formed shown in Embodiment 1 are merely examples, and can be variously modified. Both a spotted pattern and a linear pattern can be variously modified in terms of the size, shape, and layout thereof. This is because these elements are determined according to the properties of the fluid.

Also, the method for manufacturing a substrate is not limited to those given in Embodiments 2 to 8 above, and various permutations thereof are possible, as long as [the substrate] is divided into a pattern formation region and a pattern non-formation region.

INDUSTRIAL APPLICABILITY

With the present invention, a region having an affinity to a fluid and a region not having an affinity to a fluid are regularly disposed on a substrate, which makes it possible to provide a substrate with which a suitable amount of fluid can adhere to a pattern formation region of a specific surface area.

Also, the present invention comprises a step for regularly disposing a region having an affinity to a fluid and a region not having an affinity on a substrate, which makes it possible to provide a method for manufacturing a substrate with which a suitable amount of fluid can adhere to a pattern formation region of a specific surface area.

Therefore, a fine pattern that could not be formed in the past unless numerous steps were entailed using expensive equipment in a factory or the like can be manufactured easily and inexpensively.

What is claimed is:

1. A substrate comprising at least one pattern formation region, the pattern formation region comprising:
   a plurality of affinity regions, each of the affinity regions exhibiting a relatively small contact angle to a fluid so that said fluid bears thereon; and
   at least one non-affinity region exhibiting a relatively large contact angle to said fluid in order to reject said fluid therefrom;
   wherein said affinity region and said non-affinity region are formed such that the fluid is applied continuously to said affinity region and said non-affinity region between at least two of said affinity regions.

2. The substrate defined in claim 1, wherein said fluid is prohibited from moving to a region except for the pattern formation region by a surface tension of said fluid.

3. The substrate defined in claim 1, wherein each of said affinity regions is longitudinally elongated.

4. The substrate defined in claim 1, wherein said affinity regions are positioned in a scattered manner.

5. The substrate defined in claim 4, wherein each of said affinity regions is disposed in contact with at least part of an adjacent affinity region.

6. A substrate on which a fluid is to be applied, comprising:
   an affinity region exhibiting a relatively small contact angle to said fluid so that said fluids bear thereon;
   a non-affinity region exhibiting a relatively large contact angle to said fluid in order to reject said fluid therefrom, with said affinity region and said non-affinity region constituting a pattern formation region;
   wherein a thin film is made from said fluid, said thin film being formed on said affinity region whereby said thin film is patterned in the pattern formation region.

7. The substrate defined in claim 6, wherein a plurality of said pattern formation regions are formed.

8. The substrate defined in claim 6, wherein said pattern formation has a graphic shape.

9. The substrate defined in claim 6, wherein at least two non-affinity regions, between which are said affinity regions.

10. The substrate defined in claim 6, wherein said thin film is made from a material comprising at least one polar molecule, and said affinity region comprises at least one polar group.

11. The substrate defined in claim 10, wherein said non-affinity region comprises at least one of Bakelite, polyester, polyethylene, polytetrafluoroethylene, PMMA, polypropylene, and vinyl chloride.

12. The substrate defined in claim 10, wherein said affinity region comprises at least one sulfur-compound comprising at least one of OH groups and silane coupling agents comprising at least one of OH, COOH and $HN_2$ groups.

13. The substrate defined in claim 6, wherein said thin film is made from a material that does not comprise polar molecules, and said non-affinity region comprises at least one polar group.

14. The substrate defined in claim 13, wherein said non-affinity region comprises at least one of polyvinyl alcohol, polyacrylic acid, nylon, and glass.

15. The substrate defined in claim 13, wherein said affinity region comprises at least one sulfur-compound comprising at least one alkyl group or organic compound film.

* * * * *